US012513982B2

(12) United States Patent
Jeong et al.

(10) Patent No.: US 12,513,982 B2
(45) Date of Patent: Dec. 30, 2025

(54) SEMICONDUCTOR DEVICE HAVING AN ISOLATION STRUCTURE BETWEEN ADJACENT SOURCE/DRAIN REGIONS

(71) Applicant: Samsung Electronics Co., Ltd., Suwon-si (KR)

(72) Inventors: Youncheol Jeong, Hwaseong-si (KR); Jaeung Koo, Yongin-si (KR); Kwansung Kim, Yongin-si (KR); Seungyoon Kim, Suwon-si (KR); Boun Yoon, Seoul (KR); Jooho Jung, Suwon-si (KR); Sukbae Joo, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 720 days.

(21) Appl. No.: 17/569,363

(22) Filed: Jan. 5, 2022

(65) Prior Publication Data
US 2022/0310594 A1    Sep. 29, 2022

(30) Foreign Application Priority Data

Mar. 26, 2021  (KR) .................. 10-2021-0039595

(51) Int. Cl.
*H10D 84/85*       (2025.01)
*H01L 21/02*       (2006.01)
(Continued)

(52) U.S. Cl.
CPC ......... *H10D 84/85* (2025.01); *H01L 21/0259* (2013.01); *H10D 30/031* (2025.01);
(Continued)

(58) Field of Classification Search
CPC ........... H10D 84/0158; H10D 84/0193; H10D 84/834; H10D 84/853; H10D 86/011;
(Continued)

(56) References Cited

U.S. PATENT DOCUMENTS

| 9,865,704 B2 | 1/2018 | Xie et al. |
| 10,825,741 B2 | 11/2020 | Zang et al. |

(Continued)

FOREIGN PATENT DOCUMENTS

| KR | 1020160122910 A | 10/2016 |
| KR | 1020190004968 A | 1/2019 |

OTHER PUBLICATIONS

Yota et al., "Comparison between HDPCVD and PECVD Silicon Nitride for Advanced Interconnect Applications", IEEE, p. 76-78. (Year: 2000).*

*Primary Examiner* — Younes Boulghassoul
(74) *Attorney, Agent, or Firm* — Muir Patent Law, PLLC

(57) ABSTRACT

A semiconductor device includes an active region extending in a first direction on a substrate, a plurality of channel layers vertically spaced apart from each other on the active region, a gate structure vertically overlapping the active region and the plurality of channel layers on the substrate, extending in a second direction, and including a gate electrode surrounding the plurality of channel layers and a gate capping layer disposed on an upper surface of the gate electrode, a first source/drain region disposed on a side of the gate structure on the active region and in contact with the plurality of channel layers, an isolation structure intersecting the active region on the substrate, extending in the second direction, and disposed between the first source/drain region and a second source/drain region adjacent to each other, and contact structures in contact with the source/drain regions.

19 Claims, 25 Drawing Sheets

(51) Int. Cl.
*H10D 30/01* (2025.01)
*H10D 30/67* (2025.01)
*H10D 62/10* (2025.01)
*H10D 64/01* (2025.01)
*H10D 84/01* (2025.01)
*H10D 84/03* (2025.01)

(52) U.S. Cl.
CPC ..... *H10D 30/6713* (2025.01); *H10D 30/6729* (2025.01); *H10D 30/6735* (2025.01); *H10D 30/6757* (2025.01); *H10D 62/118* (2025.01); *H10D 64/017* (2025.01); *H10D 64/018* (2025.01); *H10D 84/0167* (2025.01); *H10D 84/017* (2025.01); *H10D 84/0186* (2025.01); *H10D 84/0188* (2025.01); *H10D 84/038* (2025.01)

(58) Field of Classification Search
CPC ............... H10D 86/215; H10D 30/024; H10D 30/0241; H10D 30/0243; H10D 30/0245; H10D 30/62; H10D 30/6211; H10D 30/6212; H10D 30/6213; H10D 30/6215; H10D 30/6217; H10D 30/6218; H10D 30/6219; H10D 30/6757; H10D 30/6735; H10D 30/501; H10D 30/502; H10D 30/503; H10D 30/504; H10D 30/506; H10D 30/507; H10D 30/508; H10D 30/509; H10D 30/014; H10D 30/019; H10D 30/0191; H10D 30/0193; H10D 30/0194; H10D 30/0195; H10D 30/0196; H10D 30/0197; H10D 30/0198; H10D 62/121; H10D 84/851; H10D 84/852; H10D 84/832; H10D 84/833; H10D 62/115; H10D 62/116; H10D 84/0151; H10D 84/0153; H10D 84/0188; H10D 64/681–685; H10D 64/693; H10B 12/36; H10B 12/056; H01L 21/76224; H01L 21/76229; H01L 21/76232; H01L 21/28247; H01L 21/76829; H01L 21/76832; H01L 21/76834; H01L 21/02362

See application file for complete search history.

(56) References Cited

U.S. PATENT DOCUMENTS

| | | | |
|---|---|---|---|
| 2016/0307890 A1* | 10/2016 | Yeo | H01L 27/088 |
| 2017/0141211 A1 | 5/2017 | Xie et al. | |
| 2018/0261596 A1* | 9/2018 | Jun | H01L 29/41791 |
| 2019/0013314 A1* | 1/2019 | Choi | H01L 23/5283 |
| 2019/0109045 A1* | 4/2019 | Xie | H10D 84/0158 |
| 2020/0119004 A1* | 4/2020 | Ching | H10D 84/013 |
| 2020/0243643 A1* | 7/2020 | Yu | H10D 64/017 |
| 2020/0258788 A1 | 8/2020 | Lin et al. | |
| 2020/0312718 A1 | 10/2020 | Zang et al. | |
| 2020/0373196 A1 | 11/2020 | Li et al. | |
| 2020/0381307 A1 | 12/2020 | Xie et al. | |
| 2021/0036121 A1* | 2/2021 | Lim | H10D 30/6735 |
| 2021/0074697 A1* | 3/2021 | Baek | H01L 27/0207 |
| 2021/0098338 A1* | 4/2021 | Liaw | H01L 21/823821 |
| 2021/0098627 A1* | 4/2021 | Liaw | H01L 29/775 |
| 2021/0183855 A1* | 6/2021 | Ng | H01L 21/30604 |
| 2021/0305401 A1* | 9/2021 | Liaw | H10D 62/116 |
| 2021/0327876 A1* | 10/2021 | Kim | H01L 21/823878 |
| 2021/0328010 A1* | 10/2021 | Kim | H01L 27/092 |
| 2021/0376072 A1* | 12/2021 | Yu | H10D 62/115 |
| 2022/0013630 A1* | 1/2022 | Park | H01L 21/76224 |

\* cited by examiner

SEMICONDUCTOR DEVICE HAVING AN ISOLATION STRUCTURE BETWEEN ADJACENT SOURCE/DRAIN REGIONS

CROSS-REFERENCE TO RELATED APPLICATION(S)

This application claims benefit of priority under 35 U.S.C. § 119 to Korean Patent Application No. 10-2021-0039595 filed on Mar. 26, 2021 in the Korean Intellectual Property Office, the disclosure of which is incorporated herein by reference in its entirety.

BACKGROUND

The present inventive concept relates to a semiconductor device and a method of manufacturing a semiconductor device.

In line with growing demand for semiconductor devices having high performance, high speed, and/or multifunctionality, the degree of integration of the semiconductor device has increased. In manufacturing a semiconductor device having a fine pattern corresponding to the trend of high integration in semiconductor devices, it is beneficial to implement patterns having a fine width or a fine distance between patterns. In addition, to overcome limitations of operating characteristics due to a reduction in size of planar metal oxide semiconductor field effect transistors (MOSFETs), efforts have been made to develop semiconductor devices including FinFETs having a three-dimensional channel structure.

SUMMARY

An aspect of the present inventive concept is to provide a semiconductor device having improved reliability.

According to an aspect of the present inventive concept, a semiconductor device includes: an active region extending in a first direction on a substrate, a plurality of channel layers vertically spaced apart from each other on the active region, a gate structure vertically overlapping the active region and the plurality of channel layers on the substrate, extending in a second direction, and including a gate electrode surrounding the plurality of channel layers and a gate capping layer disposed on an upper surface of the gate electrode, a first source/drain region disposed on a side of the gate structure on the active region and disposed to be in contact with the plurality of channel layers, an isolation structure intersecting the active region on the substrate, extending in the second direction, and disposed between the first source/drain region and a second source/drain region adjacent to each other, and contact structures in contact with the source/drain regions on the source/drain regions, wherein an upper surface of the isolation structure is disposed at a height lower than that of an upper surface of the gate capping layer in a direction, perpendicular to an upper surface of the substrate.

According to another aspect of the present inventive concept, a semiconductor device includes an active region extending in a first direction on a substrate, gate structures vertically overlapping the active region on the substrate, extending in a second direction and including a gate electrode and a gate capping layer disposed on the gate electrode, and an isolation structure intersecting the active region to divide the active region into two sub-active regions on the substrate, extending in the second direction, disposed between the gate structures adjacent to each other, and isolating the sub-active regions from each other, wherein an upper surface of the isolation structure is disposed at a level between an uppermost surface of the gate structure and a lower surface of the gate structure.

According to another aspect of the present inventive concept, a method of manufacturing a semiconductor device includes forming sacrificial gate structures, including a sacrificial layer, on an active region of a substrate, removing the sacrificial layer and forming gate structures, each of the gate structures including a gate electrode and a gate capping layer including a first silicon nitride-based material, forming an intermediate insulating layer on the gate structures and subsequently forming an isolation opening between the gate structures adjacent to each other through the intermediate insulating layer, at least one of the gate structures, and at least a portion of the substrate, forming an isolation pattern including a second silicon nitride-based material and having hardness or density less than that of the gate capping layer in the isolation opening, and performing planarization to remove a portion of the isolation pattern and the entire intermediate insulating layer so that an upper surface of the gate capping layer is exposed.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
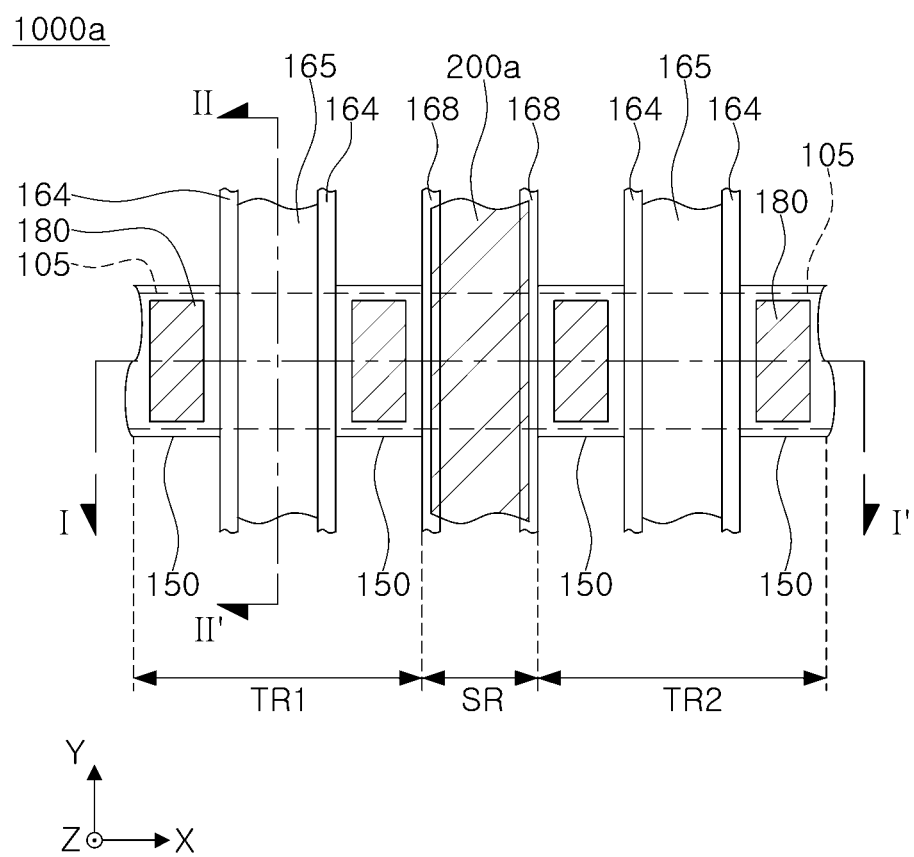
FIG. 1 is a plan view illustrating a semiconductor device according to example embodiments.

FIG. 1 is a plan view illustrating a semiconductor device according to example embodiments.

Figure 2:
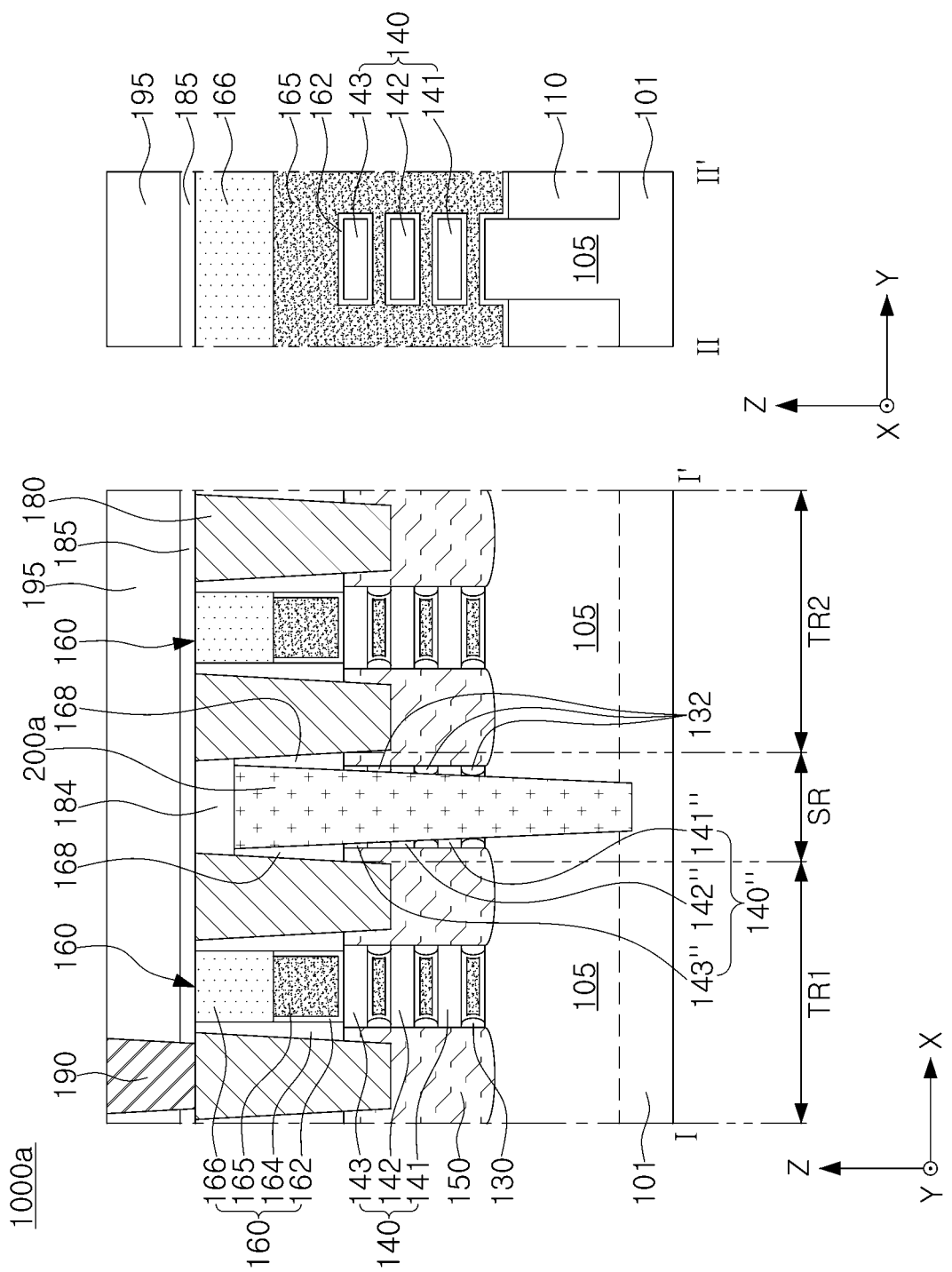
FIG. 2 is a cross-sectional view illustrating a semiconductor device according to example embodiments.

FIG. 2 is a cross-sectional view illustrating a semiconductor device according to example embodiments. FIG. 2 illustrates cross-sections of the semiconductor device of FIG. 1, taken along lines I-I' and II-II'. For convenience of description, only major components of the semiconductor device are illustrated in FIGS. 1 and 2.

Referring to FIGS. 1 and 2, a semiconductor device 1000*a* may include a substrate 101, an active region 105 on the substrate 101, channel structures 140 including a plurality of channel layers 141, 142, and 143 disposed to be vertically spaced apart from each other on the active region 105, source/drain regions 150 in contact with the plurality of channel layers 141, 142, and 143, gate structures 160 extending to intersect/cross the active region 105, contact structures 180 connected to the source/drain regions 150, and an isolation structure 200a between the source/drain regions 150. The gate structure 160 may include a gate dielectric layer 162, a gate electrode 165, gate spacer layers 164, and a gate capping layer 166. The semiconductor device 1000a may further include an isolation spacer layer 168 disposed on a side surface of the isolation structure 200a. However, in some embodiments, the isolation spacer layer 168 may be omitted. The semiconductor device 1000a may further include a first insulating layer 184 disposed on the isolation structure 200a. The semiconductor device 1000a may further include device isolation layers 110, internal spacer layers 130, an etch stop layer 185, a second insulating layer 195, and a conductive via 190. The semiconductor device 1000a may further include an isolation insulating layer 132 and a plurality of dummy channel layers 140" disposed on both sidewalls of the isolation structure 200a.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The semiconductor device 1000a may include a plurality of transistors, and a plurality of regions including each transistor may be defined. Also, in the semiconductor device 1000a, a plurality of different regions for isolating each transistor may be defined. For example, in the semiconductor device 1000a, a first transistor region TR1, a second transistor region TR2, and an isolation region SR between the first transistor region TR1 and the second transistor region TR2 may be defined on the substrate 101. The first and second transistor regions TR1 and TR2 may include the channel structures 140 on active regions 105, the gate structures 160 surrounding the channel structures 140, and the source/drain regions 150 in contact with the channel structures 140 on the active regions 105. The first and second transistor regions TR1 and TR2 may be NMOS and PMOS regions, respectively, or may be the same type of transistor regions. The isolation region SR may isolate the first transistor region TR1 and the second transistor region TR2 from each other in a first direction, e.g., an X direction. The isolation region SR may include the isolation spacer layers 168 and the isolation structure 200a.

In the semiconductor device 1000a, the active region 105 may have a fin structure, and the gate electrode 165 may be disposed between the active region 105 and the channel structure 140, between the plurality of channel layers 141, 142, and 143 of the channel structures 140, and on the channel structure 140. Accordingly, the semiconductor device 1000a may include a gate-all-around type field effect transistor formed by the channel structures 140, the source/drain regions 150, and the gate structures 160.

The substrate 101 may have an upper surface extending in the X direction and a Y direction. The substrate 101 may include or be formed of a semiconductor material, e.g., a group IV semiconductor, a group III-V compound semiconductor, or a group II-VI compound semiconductor. For example, the group IV semiconductor may include or may be silicon, germanium, or silicon-germanium. The substrate 101 may be provided as a bulk wafer, an epitaxial layer, a silicon on insulator (SOI) layer, a semiconductor on insulator (SeOI) layer, or the like.

The device isolation layer 110 may define the active region 105 in the substrate 101. The device isolation layer 110 may be formed by, e.g., a shallow trench isolation (STI) process. In some embodiments, the device isolation layer 110 may further include a region having a step and extending to be deeper to a lower portion of the substrate 101. The device isolation layer 110 may partially expose an upper portion of the active region 105. In some embodiments, the device isolation layer 110 may have a curved upper surface having a level getting higher in a direction toward the active region 105. For example, a center portion of a top surface of the isolation layer 110 may be lower than edge portions of the top surface of the isolation layer 110. The device isolation layer 110 may be formed of an insulating material. The device isolation layer 110 may be formed of, e.g., an oxide, a nitride, or a combination thereof.

The active region 105 may be defined by the device isolation layer 110 in the substrate 101 and may be disposed to extend in the first direction, e.g., the X direction. The active region 105 may have a structure protruding from the substrate 101. An upper end of the active region 105 may be disposed to protrude from an upper surface of the device isolation layer 110 to a predetermined height. The active region 105 may be formed as a portion of the substrate 101 or may include an epitaxial layer grown from the substrate 101. For example, the active region 105 may be integrally formed with the substrate 101 by patterning a portion of the substrate 101. The active region 105 on the substrate 101 may be partially recessed on both sides of the gate structures 160, and the source/drain regions 150 may be disposed on the recessed active region 105. The active region 105 may include impurities or may include doped regions including impurities.

The channel structure 140 may include two or more channel layers, e.g., first to third channel layers 141, 142, and 143, disposed to be spaced apart from each other in a direction, perpendicular to an upper surface of the active region 105, e.g., in a Z direction, on the active region 105. For example, the Z direction may be a vertical direction. The first to third channel layers 141, 142, and 143 may be connected to and/or contact the source/drain regions 150 and spaced apart from the upper surface of the active region 105. The first to third channel layers 141, 142, and 143 may have a width the same or similar to that of the active region 105 in the Y direction and may have a width the same or similar to that of the gate structure 160 in the X direction. However, in some embodiments, the first to third channel layers 141, 142, and 143 may have a reduced width so that side surfaces thereof may be positioned below the gate structure 160 in the X direction. For example, the side surfaces of the first to third channel layers 141, 142, and 143 may vertically overlap the gate structure 160.

Spatially relative terms, such as "beneath," "below," "lower," "above," "upper" and the like, may be used herein for ease of description to describe positional relationships. It will be understood that the spatially relative terms encompass different orientations of the device in addition to the orientation depicted in the figures. Directional terms, e.g., vertical and horizontal, will be also understood similarly.

The first to third channel layers 141, 142, and 143 may be formed of a semiconductor material and may include, e.g., at least one of silicon (Si), silicon germanium (SiGe), and germanium (Ge). The first to third channel layers 141, 142, and 143 may be formed of, e.g., the same material as the substrate 101. In some embodiments, the first to third channel layers 141, 142, and 143 may include an impurity region positioned in a region adjacent to the source/drain regions 150. The number and shape of the a plurality of channel layers 141, 142, and 143 constituting one channel structure 140 may vary by embodiment. For example, in some embodiments, the channel structure 140 may further include a channel layer disposed on the upper surface of the active region 105.

The source/drain regions 150 may be disposed on both sides of the channel structure 140 on the active region 105. The source/drain regions 150 may be disposed to cover the upper surface of the active region 105 on side surfaces of the first to third channel layers 141, 142, and 143 of the channel structure 140 and a lower end of the source/drain regions 150. For example, the lower end of the source/drain regions 150 may contact the active region 105. The source/drain regions 150 may be disposed by partially recessing an upper portion of the active region 105, but the presence or absence of the recess and a depth of the recess may vary by embodiment. For example, the boundary between the active region 105 and the source/drain regions 150 may be curved. For example, the source/drain regions 150 may have a convex surface at the boundary and the active region 105 may have a concave surface at the boundary. The source/drain regions 150 may be a semiconductor layer including e.g., silicon (Si), and may include different types of impurities or impurities having different concentrations.

The gate structure 160 may be disposed above the active region 105 and the channel structures 140, intersect/cross the active region 105 and the channel structures 140, and extend in one direction, e.g., in the Y direction. Channel regions of transistors may be formed in the active region 105 and the channel structures 140 intersecting the gate structure 160. For example, channel regions may be formed in the active region 105 vertically overlapping the gate structure 160 and in the channel structures 140. The gate structure 160 may include the gate electrode 165, the gate dielectric layer 162 between the gate electrode 165 and the plurality of channel layers 141, 142, and 143, gate spacer layers 164 on the side surfaces of the gate electrode 165, and the gate capping layer 166 on the upper surface of the gate electrode 165.

The gate dielectric layer 162 may be disposed between the active region 105 and the gate electrode 165 and between the channel structure 140 and the gate electrode 165, and may be disposed to cover at least some of surfaces of the gate electrode 164. For example, the gate dielectric layer 162 may be disposed to surround all surfaces except the uppermost surface of the gate electrode 165. The gate dielectric layer 162 may extend between the gate electrode 165 and the gate spacer layers 164, but is not limited thereto. The gate dielectric layer 162 may include or be formed of an oxide, a nitride, or a high-k material. The high-k material may be a dielectric material having a dielectric constant higher than that of a silicon oxide film ($SiO_2$). The high-k material may be any one of, e.g., aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may be disposed on the active region 105, fill portions between the plurality of channel layers 141, 142, and 143, and extend upwardly from the channel structure 140. The gate electrode 165 may be spaced apart from the plurality of channel layers 141, 142, and 143 by the gate dielectric layer 162. The gate electrode 165 may include or be formed of a conductive material and may include or be formed of, e.g., a metal nitride such as titanium nitride (TiN), tantalum nitride (TaN), or tungsten nitride (WN), and/or a metal such as aluminum (Al), tungsten. (W), or molybdenum (Mo), or a semiconductor material such as doped polysilicon. The gate electrode 165 may be formed of two or more layers. For example the gate electrode 165 may be have multi-layers with different materials in in respective layers.

The gate capping layer 166 may be disposed on the gate electrode 165. The gate capping layer 166 may be disposed on an upper surface of the gate electrode 165 and extend in the second direction, e.g., the Y direction. Side surfaces of the gate capping layer 166 may be surrounded by gate spacer layers 164. The gate capping layer 166 may include or be formed of a material having an etch selectivity with respect to an intermediate insulating layer 183 which will be described with reference to FIGS. 17 to 20 below. The gate capping layer 166 may include or be formed of a material having an etch selectivity with respect to the first insulating layer 184. The gate capping layer 166 may include or be formed of a first material including a silicon nitride-based material. The silicon nitride-based material may be, e.g., SiN, SiCN, SiON, or SiOCN. At least one of density and hardness of the gate capping layer 166 may be higher than that of the isolation structure 200a, which will be described later.

The gate spacer layers 164 may be disposed on both side surfaces of the gate electrode 165 and may extend in the Z direction, perpendicular to the upper surface of the substrate 101. For example, the upper surface of the substrate 101 may be a surface contacting a bottom surface of the device isolation layer 110. The gate spacer layers 164 may be disposed on both sides of the gate electrode 165 and on both sides of the gate capping layer 166. The gate spacer layers 164 may insulate the source/drain regions 150 from the gate electrodes 165. The gate spacer layers 164 may have a multi-layer structure according to some embodiments. The gate spacer layers 164 may include or be formed of at least one of oxide, nitride, oxynitride, and silicon nitride-based materials. In an example embodiment, an upper surface of each of the gate spacer layers 164 may be substantially coplanar with an upper surface of the gate capping layer 166, but is not limited thereto.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," "substantially planar," or "substantially coplanar" may be exactly the same, equal, planar, or coplanar, or may be the same, equal, planar or coplanar within acceptable variations that may occur, for example, due to manufacturing processes.

The internal spacer layers 130 may be disposed between the channel structures 140 and in parallel with the gate electrode 165. The internal spacer layers 130 may be disposed on both sides of the gate structure 140 in the first direction, e.g., the X direction, on each of lower surfaces of the first to third channel layers 141, 142, and 143. The internal spacer layers 130 may have outer surfaces substantially coplanar with the outer surfaces of the first to third channel layers 141, 142, and 143. Below the third channel layer 143, the gate electrode 165 may be spaced apart from the source/drain regions 150 by the internal spacer layers 130 so as to be electrically separated/insulated from each other. The internal spacer layers 130 may have a shape in which a side surface thereof facing the gate electrode 165 is convexly rounded toward the gate electrode 165, but the shape is not limited thereto. For example, the gate electrode 165 may have a concave surface facing an internal spacer layer 130. The internal spacer layers 130 may include or be formed of at least one of oxide, nitride, and oxynitride. In another embodiment, the internal spacer layers 130 may be omitted.

The isolation structure 200a may be disposed to intersect the active region 105 and extend in the second direction, e.g., the Y direction, on the substrate 101. The isolation structure 200a may extend in a direction, perpendicular to the upper surface of the substrate 101, e.g., in the Z direction. The isolation structure 200a may be disposed between the source/drain regions 150 adjacent to each other. For example, the isolation structure 200a may divide the active region 105 into two sub-active regions, e.g., by intersecting or passing through the active region 105 and may electrically insulate/isolate the two sub-active regions form each other.

The isolation structure 200a may include or be formed of an insulating material. The isolation structure 200a may include or be formed of a second material including a silicon nitride-based material. For example, the isolation structure 200a may include or be formed of at least one of SiN, SiCN, SiON, and SiOCN, but the material of the isolation structure 200a is not limited thereto. At least one of density and hardness of the isolation structure 200a may be smaller than that of the gate capping layer 166. At least one of density and hardness of the second material of the isolation structure 200a may be less than those of the first material of the gate capping layer 166. Since the isolation structure 200a has a density and/or hardness less than those of the gate capping layer 166, an upper surface of the isolation structure 200a may be disposed to have a height lower than that of an upper surface of the gate capping layer 166 in a direction perpendicular to the substrate in a planarization process of removing the intermediate insulating layer 183 described with reference to FIG. 20.

The upper surface of the isolation structure 200a may be disposed at a height level between the upper surface of the gate structure 160 and the lower surface of the gate structure 160. The upper surface of the isolation structure 200a may be positioned at a height lower than that of the upper surface of the gate capping layer 166 in the Z direction, perpendicular to the upper surface of the substrate 101. The upper surface of the isolation structure 200a may be positioned on a height level between the lower surface of the gate electrode 165 and the upper surface of the gate capping layer 166. The upper surface of the isolation structure 200a may be positioned at a height lower than that of the upper surface of the gate spacer layer 164 in the Z direction, perpendicular to the upper surface of the substrate 101. The upper surface of the isolation structure 200a may be disposed on a level between the upper surface of the gate capping layer 166 and the lower surface of the gate capping layer 166, but the level of the upper surface is not limited thereto. For example, the upper surface of the isolation structure 200a may be disposed lower than the lower surface of the gate capping layer 166.

In example embodiments, the isolation structure 200a may have an inclined side surface in which a width of a lower portion thereof is smaller than a width of an upper portion thereof depending on its aspect ratio, but the shape of the side surface is not limited thereto. For example the width of the isolation structure 200a may decrease in a direction approaching the bottom surface of the substrate 101. The lower portion of the isolation structure 200a may have a flat surface or may have a convex shape or a pointed shape toward the substrate 101, but the shape of bottom surface of the isolation structure is not limited thereto.

A lower end of the isolation structure 200a may be positioned lower than a lower end of the active region 105 by a predetermined depth. For example, the isolation structure 200a may extend in the Z direction from above the substrate 101 to penetrate the active region 105, and the lower end of the isolation structure 200a may be positioned lower than the lower end of the active region 105. In other example embodiments, the lower end of the isolation structure 200a may be positioned to be lower than lower ends of the source/drain regions 150 but may be positioned higher than the lower end of the active region 105, but the level of the lower end of the isolation structure 200a is not limited thereto.

The semiconductor device 1000a may further include the first insulating layer 184 disposed on the upper surface of the isolation structure 200a. The first insulating layer 184 may be disposed on the upper surface of the isolation structure 200a. The first insulating layer 184 may be disposed between the etch stop layer 185 and the isolation structure 200a in the Z direction. The isolation structure 200a may not contact the etch stop layer 185 and may be disposed to be spaced apart from the etch stop layer 185. In an example embodiment, a side surface of the first insulating layer 184 may contact the contact structure 180. The first insulating layer 184 may include or be formed of an insulating material. For example, the first insulating layer 184 may include or be formed of an oxide or a compound including silicon.

The isolation spacer layers 168 may be positioned at the same height as the gate spacer layers 164 in the Z direction, perpendicular to the upper surface of the substrate 101 and may be disposed on both side surfaces of the isolation structure 200a. For example, the isolation spacer layers 168 may horizontally overlap the gate spacer layers 164. The isolation spacer layers 168 may have the same shape as a shape in which the gate spacer layers 164 are removed by a predetermined width in the X direction from one side surface thereof. One side surface of the isolation spacer layers 168 may include or may be an inclined surface with respect to the substrate 101. However, the shape of the isolation spacer layers 168 is not limited thereto and may have the same shape as the gate spacer layers 164. In example embodiments, the isolation spacer layers 168 may have a multi-layer structure. In another embodiment, the isolation spacer layers 168 may be omitted.

Upper surfaces of the isolation spacer layers 168 may be disposed at a height lower than that of the upper surface of the gate capping layer 166 in the Z direction. The upper surfaces of the isolation spacer layers 168 may be disposed at a height lower than that of upper surfaces of the gate spacer layers 164 in the Z direction. The upper surfaces of the isolation spacer layers 168 are illustrated as being disposed on substantially the same level as the upper surface of the isolation structure 200a in the Z direction, but the levels of the upper surfaces are not limited thereto. For example, the upper surfaces of the isolation spacer layers 168 may be disposed at a level higher than the upper surface of the isolation structure 200*a* or lower than the upper surface of the gate capping layer 166.

The isolation spacer layers 168 may include or be formed of the same material as the gate spacer layers 164. The isolation spacer layers 164 may include or be formed of at least one of oxide, nitride, oxynitride, and silicon nitride-based materials.

The semiconductor device 1000*a* may further include the isolation insulating layers 132 and the plurality of dummy channel layers 140" disposed between the isolation structure 200*a* and the source/drain regions 150 in the X direction. Accordingly, side surfaces of the isolation structures 200*a* may not contact side surfaces of the adjacent source/drain regions 150. A portion of the channel structure 140 and a portion of the internal spacer layers 130 in contact with the side surfaces of the isolation structure 200*a* may remain on the side surfaces of the isolation structure 200*a* in forms of the isolation insulating layers 132 and the dummy channel layers 140". The isolation insulating layers 132 may have a form in which a portion of the internal spacer layers 130 remain, and may be disposed between each pair of the plurality of dummy channel layers 141", 142", and 143" in the Z direction. The isolation insulating layers 132 may include or be formed of the same material as the internal spacer layers 130. The plurality of dummy channel layers 140" may include or be formed of the same material as that of the channel structure 140 and may be portions of the channel structure 140 remains on the side surfaces of the isolation structure 200*a*.

The contact structure 180 may be electrically connected to and/or contact the source/drain regions 150 through the etch stop layer 185 and the second insulating layer 195, and may apply an electrical signal to the source/drain regions 150. The contact structure 180 may be disposed on the source/drain regions 150 as shown in FIG. 1, and may have a length longer in the Y direction than the source/drain regions 150 in some embodiments. The contact structure 180 may have an inclined side surface of which a lower width thereof is smaller than an upper width thereof depending on its aspect ratio, but the shape of the side surface is not limited thereto. For example, the contact structure 180 may have a horizontal width (e.g., in the X direction) decreasing in a direction approaching the bottom surface of the substrate 101. The contact structure 180 may extend from the same level as the upper surface of the gate structure 160 to below a height of the upper surface of the third channel layer 143, for example. The contact structure 180 may extend, e.g., to a height corresponding to the upper surface of the second channel layer 142, but is not limited thereto. In example embodiments, the contact structure 180 may contact the upper surface of the source/drain regions 150. For example, the source/drain regions 150 may have a flat top surface e.g., without having a recess on the top surface of the source/drain regions 150.

As used herein, components described as being "electrically connected" are configured such that an electrical signal can be transferred from one component to the other (although such electrical signal may be attenuated in strength as it transferred and may be selectively transferred).

The upper surface of the contact structure 180 may be positioned at the same height as the upper surface of the gate structure 160 in the Z direction, but the height is not limited thereto. An upper surface of at least one of the contact structures 180 may be disposed higher than the upper surface of the isolation structure 200*a* in the Z direction. The upper surface of the contact structure 180 may be positioned higher than the isolation spacer layers 168 in the Z direction.

The contact structure 180 may include or be formed of, e.g., a metal nitride such as titanium nitride (TiN), tantalum nitride (TaN), or tungsten nitride (WN), and/or a metal such as aluminum (Al), tungsten (W), or molybdenum (Mo).

The etch stop layer 185 may include or be formed of a material having an etch selectivity with respect to the second insulating layer 195. The etch stop layer 185 may be, e.g., a dielectric layer or a metal oxide layer. The etch stop layer 185 may include or be formed of, e.g., aluminum oxide, aluminum nitride, aluminum oxynitride, silicon nitride, silicon carbide, or a combination thereof.

The second insulating layer 195 may include or be formed of an insulating material. For example, the second insulating layer 195 may include or be formed of at least one of oxide, nitride, and oxynitride.

The conductive via 190 may be disposed on the contact structure 180 and may be electrically connected to the contact structure 180. The conductive via 190 may penetrate the etch stop layer 185 and the second insulating layer 195. The conductive via 190 may have a width decreasing in a direction approaching the contact structure 180. For example, the conductive via 190 may have an inclined side surface in which a lower width thereof is smaller than an upper width thereof depending on its aspect ratio, but the shape of the side surface is not limited thereto.

Next, modified embodiments of the semiconductor device of the present inventive concept will be described with reference to FIGS. 3 to 6. The same descriptions as the ones above with reference to FIGS. 1 and 2 will be omitted in the below descriptions.

Figure 3:
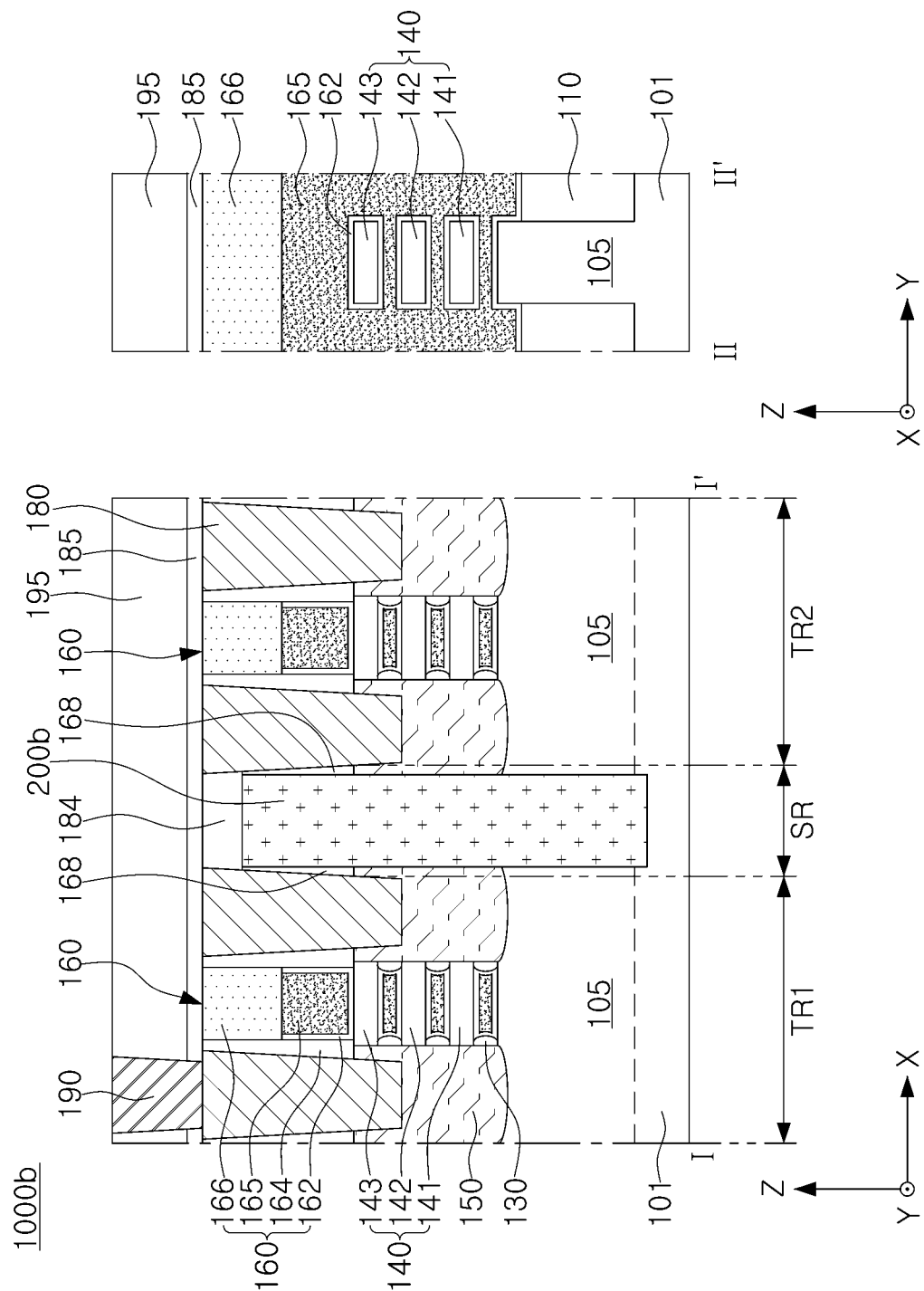
FIG. 3 is a cross-sectional view illustrating a semiconductor device according to example embodiments.

FIG. 3 is a cross-sectional view illustrating a semiconductor device according to example embodiments.

Referring to FIG. 3, in a semiconductor device 1000*b*, unlike the embodiment described above with reference to FIG. 2, an isolation structure 200*b* may be disposed between the source/drain regions 150 adjacent to each other and both side surfaces of the isolation structure 200*b* may be in contact with the source/drain regions 150 adjacent to each other. For example, a portion of the channel structure 140 and a portion of the internal spacer layers 130 in contact with side surfaces of the isolation structure 200*b*, e.g., shown in FIG. 2, may not remain on the side surfaces of the isolation structure 200*b* as shown in FIG. 3. For example, the isolation insulating layers 132 and the plurality of dummy channel layers 140" described with reference to FIG. 2 may not be formed/disposed on the side surfaces of the isolation structure 200*b* as shown in FIG. 3.

Figure 4A:
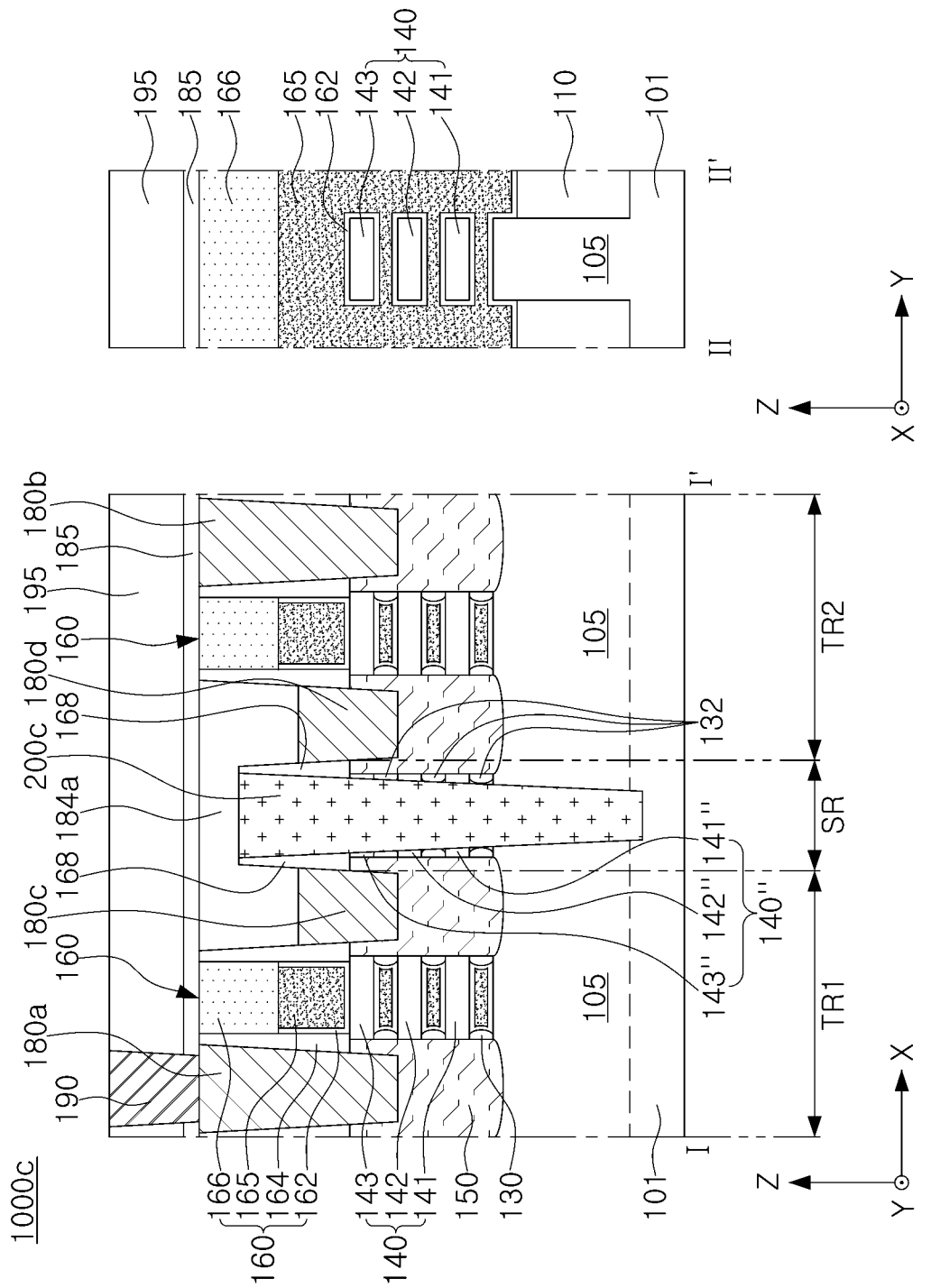
FIGS. 4A and 4B are cross-sectional views illustrating semiconductor devices according to example embodiments.
Figure 4B:
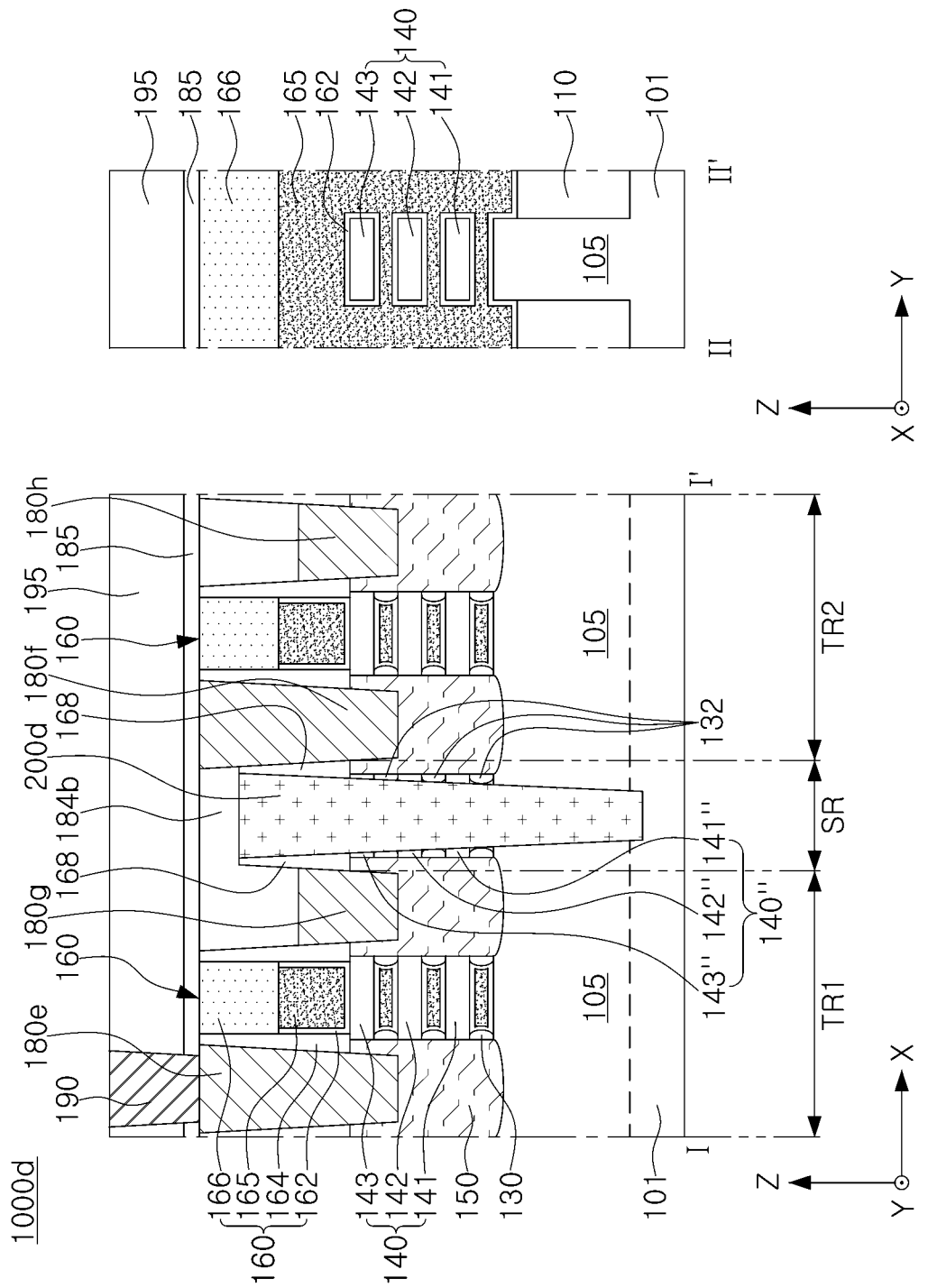

FIGS. 4A and 4B are cross-sectional views illustrating a semiconductor device according to example embodiments.

Referring to FIG. 4A, a semiconductor device 1000*c* may include contact structures 180*a*, 180*b*, 180*c*, and 180*d* including portions having different vertical thicknesses in the Z direction, a vertical direction perpendicular to the upper surface of the substrate 101.

In an example embodiment, the contact structures 180*a*, 180*b*, 180*c*, and 180*d* may include first contact structures 180*a* and 180*b* and second contact structures 180*c* and 180*d* having upper surfaces disposed at different levels from each other. In an example embodiment, an upper surface of at least one of the contact structures 180*a*, 180*b*, 180*c*, and 180*d* may be positioned at a height lower than that of an upper surface of the isolation structure 200*c* in the Z direction. Upper surfaces of the first contact structures 180*a* and 180*b* may be disposed higher than the upper surface of the isolation structure 200*c* in the Z direction. The upper surfaces of the first contact structures 180*a* and 180*b* may be disposed at substantially the same level as the upper surface of the gate structure 160, but the levels of the upper surfaces are not limited thereto. For example, the upper surfaces of the first contact structures 180a and 180b may be disposed at a level higher than the upper surface of the gate structure 160 in the Z direction. The upper surfaces of the first contact structures 180a and 180b may be disposed at substantially the same level as the upper surface of the gate capping layer 166, but levels of the upper surfaces are not limited thereto. The upper surfaces of the second contact structures 180c and 180d may be disposed at a lower level than the upper surface of the isolation structure 200c in the Z direction. The upper surfaces of the second contact structures 180c and 180d may be disposed lower than the upper surface of the gate structure 160 in the Z direction. The upper surfaces of the second contact structures 180c and 180d may be disposed lower than the upper surface of the gate capping layer 166 in the Z direction.

The second contact structures 180c and 180d having upper surfaces disposed at a level lower than a height level of the upper surface of the isolation structure 200c may be disposed on both sides of the isolation structure 200c. However, even in this case, the second contact structures 180c and 180d may include portions having upper surfaces disposed at substantially the same height as the gate structure 160 or at a level higher than the gate structure 160 in a region not shown. The first contact structure 180a and the second contact structure 180c having different height levels of upper surfaces may be disposed on both sides of one gate structure 160, but the present inventive concept is not limited thereto. For example, contact structures having upper surfaces at substantially the same height level as each other may be disposed on both side surfaces of the gate structure 160. The arrangement and height of the contact structures 180a, 180b, 180c, and 180d may be modified to vary according to embodiments.

The first contact structures 180a and 180b and the second contact structures 180c and 180d may include portions having different vertical thicknesses, e.g., at different positions in the Y direction, respectively. For example, the first contact structures 180a and 180b may include portions having upper surfaces disposed at a level lower than the upper surfaces of the first contact structures 180a and 180b shown in FIG. 4A, e.g., at different positons in the Y direction. The second contact structures 180c and 180d may include portions having upper surfaces disposed at a height level higher or lower than the upper surfaces of the second contact structures 180c and 180d shown in FIG. 4A, e.g., at different positions in the Y direction. For example, at least one of the contact structures 180a, 180b, 180c, and 180d may have a step shape due to the different height levels of the upper surfaces in the Y direction, but features of the contact structures are not limited thereto.

The semiconductor device 1000c may further include a third insulating layer 184a disposed on the upper surfaces of the second contact structures 180c and 180d and the upper surface of the isolation structure 200c. In an example embodiment, the third insulating layer 184a may surround the upper surface and at least a portion of a side surface of the isolation structure 200c. The third insulating layer 184a may include or be formed of an insulating material, e.g., an oxide.

Referring to FIG. 4B, the semiconductor device 1000d may include contact structures 180e, 180f, 180g, and 180h including portions having different vertical thicknesses in the Z direction, which is a direction perpendicular to the upper surface of the substrate 101.

In an example embodiment, the contact structures 180e, 180f, 180g, 180h may include first contact structures 180e and 180f and second contact structures 180g and 180h having upper surfaces disposed at different levels from each other. In an example embodiment, an upper surface of at least one of the contact structures 180e, 180f, 180g, and 180h may be disposed at a height lower than that of an upper surface of an isolation structure 200d in the Z direction. Upper surfaces of the first contact structures 180e and 180f may be disposed higher than the upper surface of the isolation structure 200d in the Z direction. The upper surfaces of the first contact structures 180e and 180f may be disposed at substantially the same level as the upper surface of the gate structure 160, but the present inventive concept is not limited thereto. The upper surfaces of the first contact structures 180e and 180f may be disposed at substantially the same level as the upper surface of the gate capping layer 166, but the present inventive concept is not limited thereto. Upper surfaces of the second contact structures 180g and 180h may be disposed lower than the upper surface of the isolation structure 200c in the Z direction. The upper surfaces of the second contact structures 180g and 180h may be disposed lower than the upper surface of the gate structure 160 in the Z direction. The upper surfaces of the second contact structures 180g and 180h may be disposed to be lower than the upper surface of the gate capping layer 166 in the Z direction.

The second contact structure 180g having an upper surface disposed at a level lower than a height level of the upper surface of the isolation structure 200d may be disposed on one side of the isolation structure 200d. The first contact structure 180f having an upper surface disposed at a level higher than a height level of the upper surface of the isolation structure 200d may be disposed on the other side of the isolation structure 200d. The first contact structure 180e and the second contact structure 180g having upper surfaces disposed at different height levels may be disposed on both sides of the gate structure 160, but the present inventive concept is not limited thereto. However, the arrangement and height of such contact structures may be modified to vary according to embodiments.

Each of the first contact structures 180e and 180f and the second contact structures 180g and 180h may include portions having different vertical thicknesses in the Y direction. For example, the first contact structures 180e and 180f may include portions having upper surfaces disposed at a level lower than the upper surfaces of the first contact structures 180e and 180f shown in FIG. 4B, e.g., at different positions in the Y direction. The second contact structures 180g and 180h may include portions having upper surfaces disposed at a height level higher or lower than the upper surfaces of the second contact structures 180g and 180h shown in FIG. 4B, e.g., at different positions in the Y direction. For example, at least one of the contact structures 180e, 180f, 180g, and 180h may have a step shape due to different height levels of the upper surfaces in the Y direction, but the shapes of the contact structures are not limited thereto.

The semiconductor device 1000d may further include a third insulating layer 184b disposed on the upper surface of the second contact structure 180g and the upper surface of the isolation structure 200d. In an example embodiment, the third insulating layer 184b may surround the upper surface and at least a portion of a side surface of the isolation structure 200d. For example, the third insulating layer 184b may contact the upper surface and a side surface of the isolation structure 200d. The third insulating layer 184a may include or be formed of an insulating material, e.g., an oxide.

Figure 5:
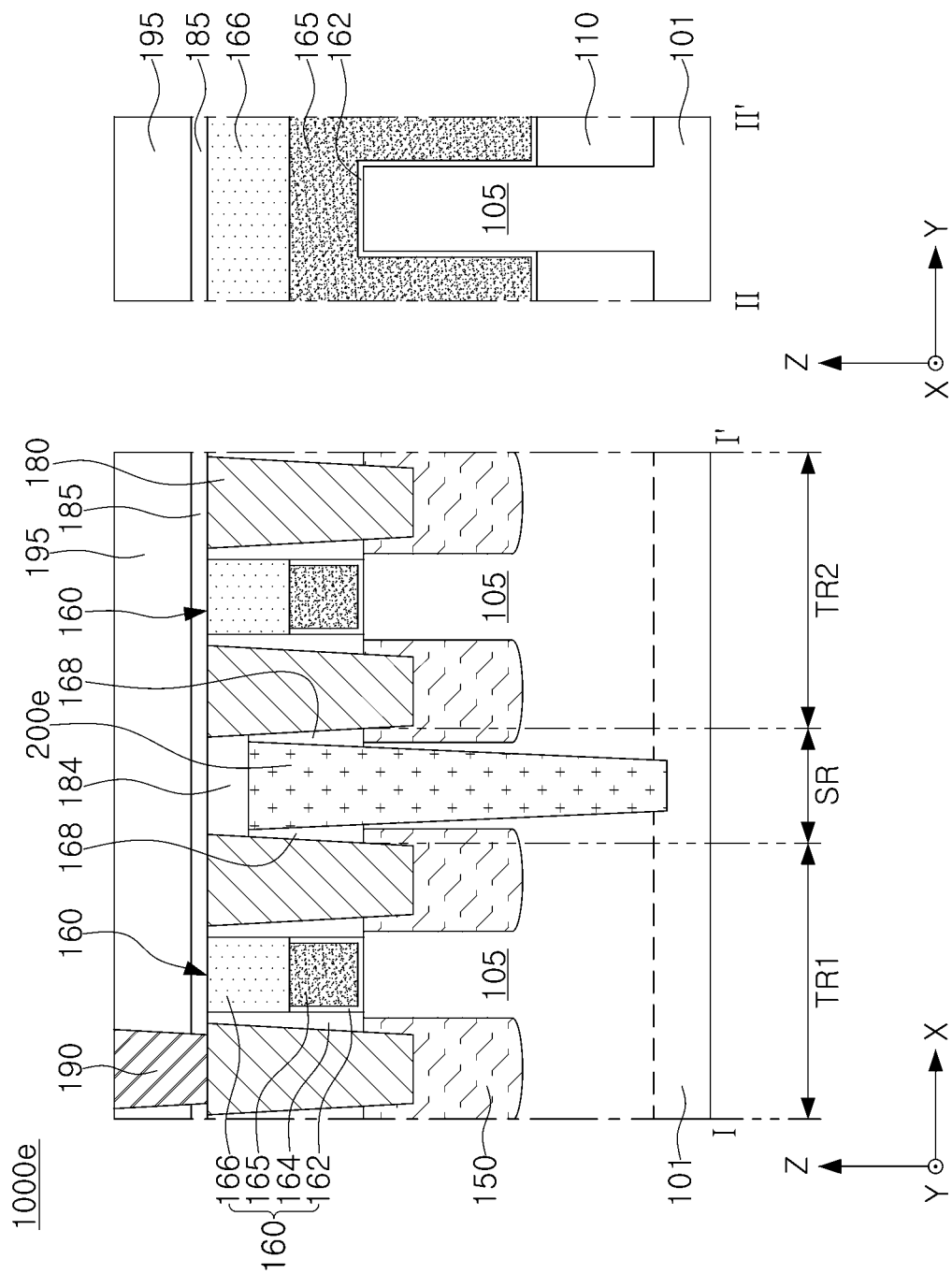
FIG. 5 is a cross-sectional view illustrating a semiconductor device according to example embodiments.

FIG. 5 is a cross-sectional view illustrating a semiconductor device according to example embodiments.

Referring to FIG. 5, cross-sections of a semiconductor device 1000e including a FinFET in which the gate structure 160 surrounds three sides of the active region 105, e.g., the upper surface of the active region 105 and side surfaces thereof in the Y direction are illustrated. Unlike the embodiment of FIG. 2, the semiconductor device 1000e may not include a plurality of channel layers. The semiconductor device 1000e may include a channel region which is a portion of the active region 105 and surrounded by the gate structure 160.

The isolation structure 200e may penetrate the gate structure 160 (e.g., a dummy gate structure) and the channel region, and a lower end of the isolation structure 200e may be positioned below a lower end of the active region 105. Side surfaces of the isolation structure 200e may not be in contact with side surfaces of the adjacent source/drain regions 150. In another embodiment, the side surfaces of the isolation structure 200e may be in contact with side surfaces of the adjacent source/drain regions 150. A lower portion (e.g., a bottom surface) of the isolation structure 200e may have a flat (plane) surface or a convex shape, but the shape is not limited thereto and may have various shapes.

Figure 6:
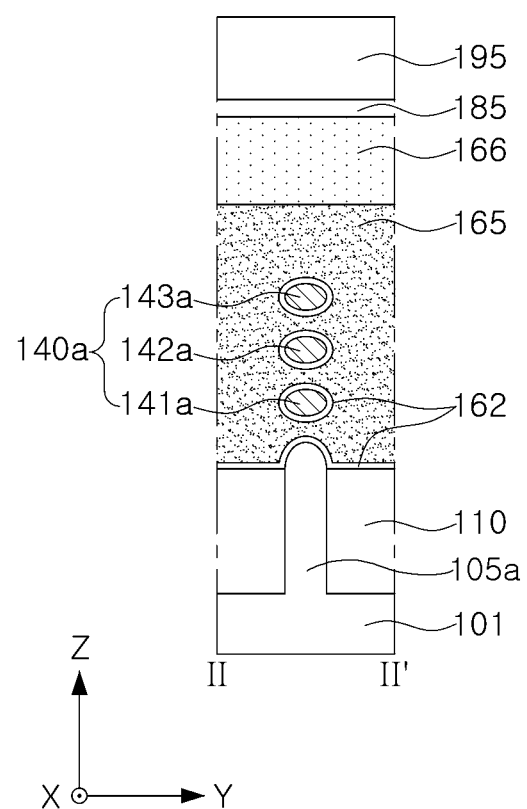
FIG. 6 is a cross-sectional view illustrating a semiconductor device according to example embodiments.

FIG. 6 is a cross-sectional view illustrating a semiconductor device according to example embodiments.

Referring to FIG. 6, in a semiconductor device 1000f, widths of an active region 105a and a channel structure 140a may be different from those of the embodiment of FIG. 2. The active region 105a and the channel structure 140a may have a relatively small width, and thus, a plurality of channel layers 141a, 142a, and 143a of the channel structure 140a may have a circular shape or an elliptical shape with a small difference between the lengths of the major axis and the minor axis of the plurality of channel layers 141a, 142a, and 143a in a cross-sectional view perpendicular to the first direction (X direction).

Figure 7:
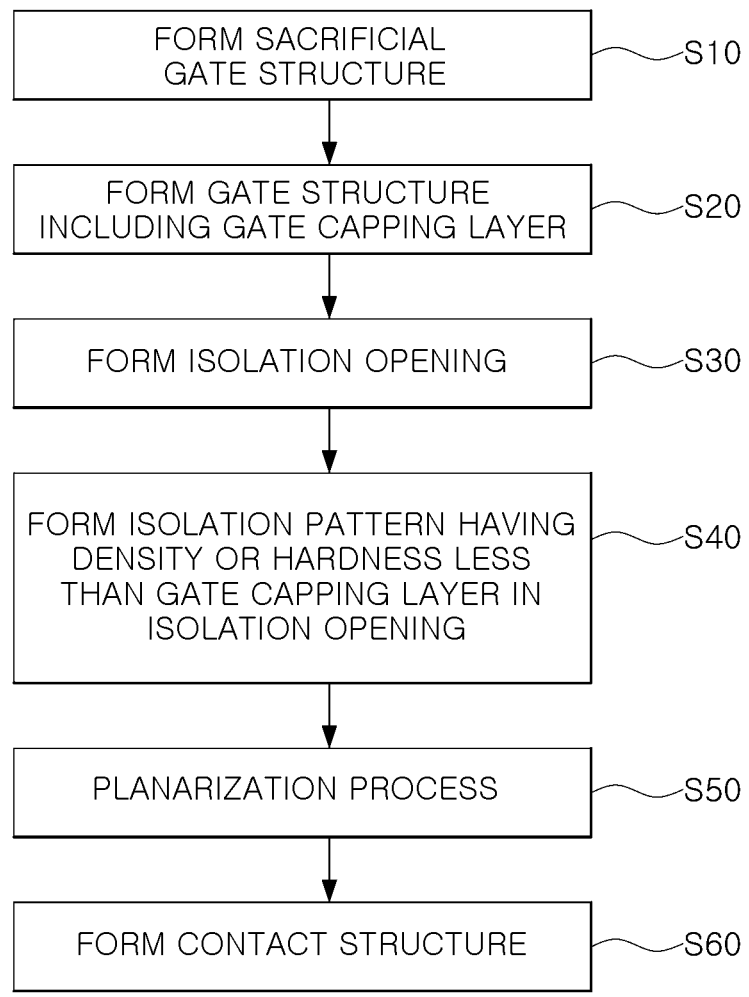
FIG. 7 is a flowchart illustrating a method of manufacturing a semiconductor device according to example embodiments.

FIG. 7 is a flowchart illustrating a method of manufacturing a semiconductor device (or a semiconductor device manufacturing method).

Referring to FIG. 7, the semiconductor device manufacturing method S1 may include an operation of forming a sacrificial gate structure (S10), an operation of forming a gate structure (S20), an operation of forming an isolation opening (S30), an operation of depositing an isolation pattern in the isolation opening (S40), and an operation of performing a planarization process (S50). In example embodiments, the semiconductor device manufacturing method S1 may further include an operation of forming a contact structure (S60). In example embodiments, the semiconductor device manufacturing method S1 may further include an operation of forming a conductive via.

In the operation of forming the sacrificial gate structure (S10), sacrificial gate structures, including a sacrificial layer, may be formed on the active region of the substrate.

In the operation of forming the sacrificial gate structure (S10), a portion of the substrate including the active region may be removed to form active structures. Next, sacrificial gate structures having a line shape extending in one direction intersecting/crossing the active structures may be formed on the active structures. Each of the sacrificial gate structures may include or be formed of sacrificial gate layers and a gate mask pattern layer. The sacrificial gate layers may be patterned using the gate mask pattern layer. Each of the sacrificial gate layers may be an insulating layer and a conductive layer, but the sacrificial gate layers are not limited thereto, and may be formed of a single layer. For example, the sacrificial gate layers may include or be formed of silicon oxide or polysilicon. The gate mask pattern layer may include or be formed of silicon oxide and/or silicon nitride.

In the operation of forming the gate structure (S20), the sacrificial layers in the sacrificial gate structure may be removed, and a gate dielectric layer, a gate electrode including or formed of a conductive material, and a gate capping layer including or formed of a silicon nitride-based material may be sequentially stacked to form gate structures. The gate capping layer may include or be formed of a first material including or formed of a silicon nitride-based material. The silicon nitride-based material may be, e.g., SiN, SiCN, SiON, or SiOCN.

In the operation of forming the isolation opening (S30), an intermediate insulating layer may be formed on the gate structures. Next, the intermediate insulating layer, at least one of the gate structures, and at least a portion of the substrate may be removed to form an isolation opening between adjacent the gate structures and isolating the active region of the substrate.

In the operation of forming the isolation pattern (S40), a second material including or formed of a silicon nitride-based material may be deposited in the isolation opening. In the operation of forming the isolation pattern (S40), an isolation pattern having hardness and/or a density smaller than that of the gate capping layer may be formed in the isolation opening. In an example embodiment, the isolation pattern may be deposited by a deposition method different from the method of depositing the gate capping layer. The isolation pattern may penetrate the intermediate insulating layer. For example, the intermediate insulating layer may horizontally overlap a portion of the isolation pattern. The portion of the isolation pattern horizontally overlapping the intermediate insulating layer may be referred to as a first portion of the isolation pattern. The first portion of the isolation pattern disposed inside or horizontally overlapping the intermediate insulating layer may have a shape in which a width in the X direction increases in a direction away/receding from the upper surface of the substrate.

In the operation of performing a planarization process (S50), a portion of the isolation pattern and the entire intermediate insulating layer may be removed to expose an upper surface of the gate capping layer. A planarization process, e.g., a chemical mechanical polishing (CMP) process, may be performed so that the upper surface of the gate capping layer is exposed using a slurry selectively removing an oxide rather than a silicon nitride-based material. In this case, since the isolation pattern has a smaller/less density and/or smaller/less hardness than the gate capping layer, the isolation pattern may be removed together by the planarization process. Accordingly, the first portion of the isolation pattern disposed inside or horizontally overlapping the intermediate insulating layer and the entire intermediate insulating layer may be removed together. Since the first portion of the isolation pattern having an increased width, e.g., compared to the remaining portions of the isolation pattern, is removed together in the intermediate insulating layer removal process, it may be beneficial to prevent contact hole formation defects in the following operation of forming a contact structure (S60). For example, the isolation pattern having a narrow width may be beneficial to avoid interference with the region in which the contact structure is formed.

In the operation of performing a planarization process (S50), since the density and/or hardness of the isolation pattern is smaller/less than the density and/or hardness of the gate capping layer, the isolation pattern may be removed more than the gate capping layer, so that an upper surface of the isolation pattern may be disposed at a height/level lower than that of an upper surface of the gate capping layer in a direction perpendicular to the substrate.

In the operation of forming a contact structure S60, a contact structure in contact with and electrically connected to the source/drain region or the gate structure may be formed. After the first insulating layer is formed on the gate structure and the isolation structure, the first insulating layer and the gate structure may be partially removed to form a through hole. A contact structure may be formed by filling the through hole with a conductive material. Since a portion of the isolation structure and the entire intermediate insulating layer are removed in the planarization process S50 to form the first insulating layer, a vertical thickness of the first insulating layer may be substantially uniform. Accordingly, the through hole may be stably formed in a region in which the contact structure is to be formed.

FIGS. 8 to 24 are diagrams illustrating a process sequence of a method of manufacturing a semiconductor device according to example embodiments. An embodiment of a method of manufacturing the semiconductor device of FIG. 2 will be described with reference to FIGS. 8 to 24.

FIGS. 8 to 13 are views illustrating an embodiment of an operation of forming a dummy gate structure (S10) described with reference to FIG. 7.

Figure 8:
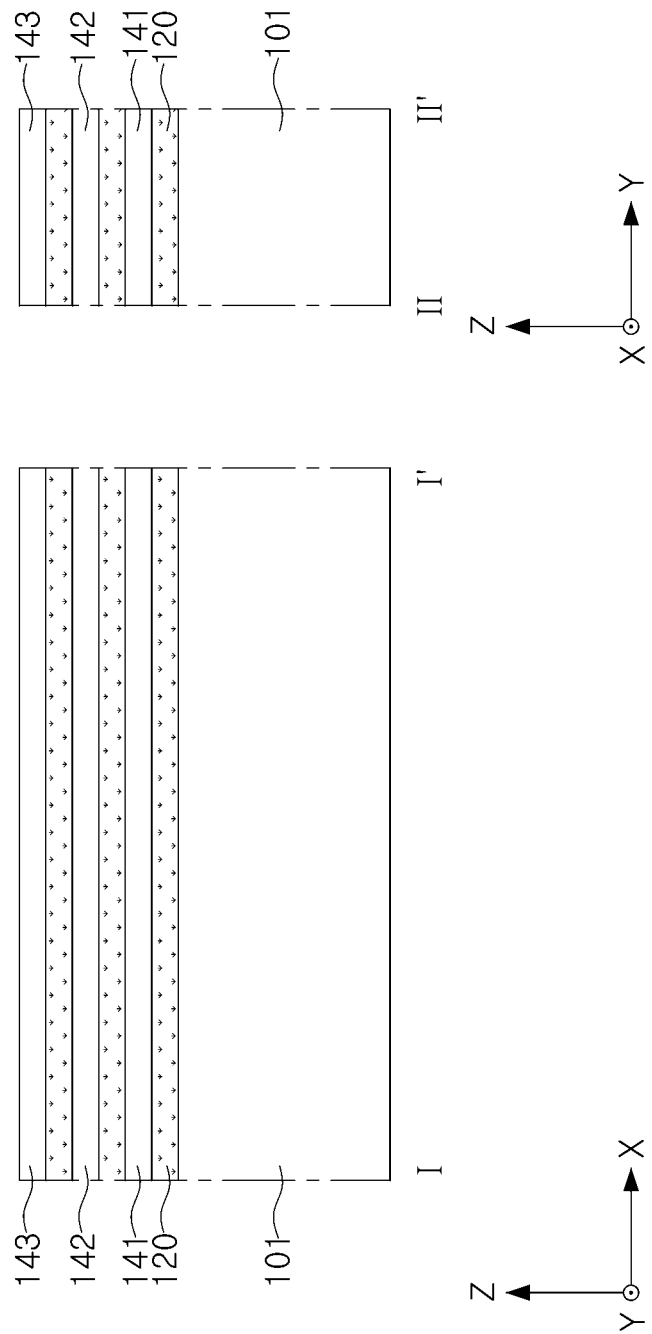
FIGS. 8 to 24 are views illustrating a process sequence of a method of manufacturing a semiconductor device according to example embodiments.

Referring to FIG. 8, sacrificial layers 120 and a plurality of channel layers 141, 142, and 143 may be alternately stacked on a substrate 101.

The sacrificial layers 120 may be replaced by the gate dielectric layer 162 and the gate electrode 165 as shown in FIG. 2 through a subsequent process. The sacrificial layers 120 may be formed of a material having an etch selectivity with respect to the plurality of channel layers 141, 142, and 143. The plurality of channel layers 141, 142, and 143 may include a material different from that of the sacrificial layers 120. The sacrificial layers 120 and the plurality of channel layers 141, 142, and 143 may include a semiconductor material including, e.g., at least one of silicon (Si), silicon germanium (SiGe), and germanium (Ge) and may include different materials, and may or may not include impurities. For example, the sacrificial layers 120 may include or be formed of silicon germanium (SiGe), and the plurality of channel layers 141, 142, and 143 may include or be formed of silicon (Si).

The sacrificial layers 120 and the plurality of channel layers 141, 142, and 143 may be formed by performing an epitaxial growth using the substrate 101 as a seed. The number of layers of the plurality of channel layers 141, 142, and 143 alternately stacked with the sacrificial layer 120 may be modified to vary in embodiments.

Figure 9:
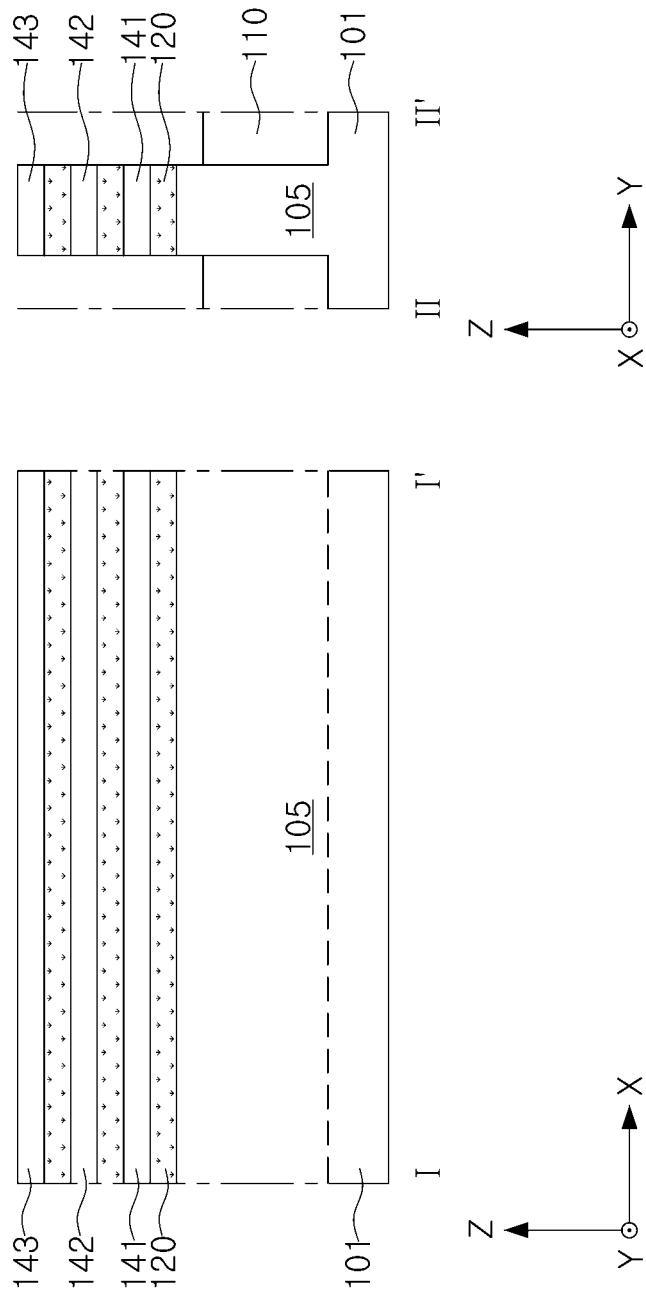

Referring to FIG. 9, portions of the stack structure of the sacrificial layers 120 and the plurality of channel layers 141, 142, and 143 and the substrate 101 may be removed to form active structures.

The active structures may include sacrificial layers 120 and the plurality of channel layers 141, 142, and 143 alternately stacked with each other, and may further include the active region 105 protruding from the upper surface of the substrate 101 by removing a portion of the substrate 101. The active structures may be formed in a line shape extending in one direction, e.g., in the X direction and may be spaced apart from each other in the Y direction.

The region in which a portion of the substrate 101 is removed may be filled with an insulating material and recessed by removing an upper portion of the insulating material so that the active region 105 protrudes from the upper surface of the insulating material, thereby forming the device isolation layers 110. An upper surface of the device isolation layers 110 may be formed to be lower than an upper surface of the active region 105.

Figure 10:
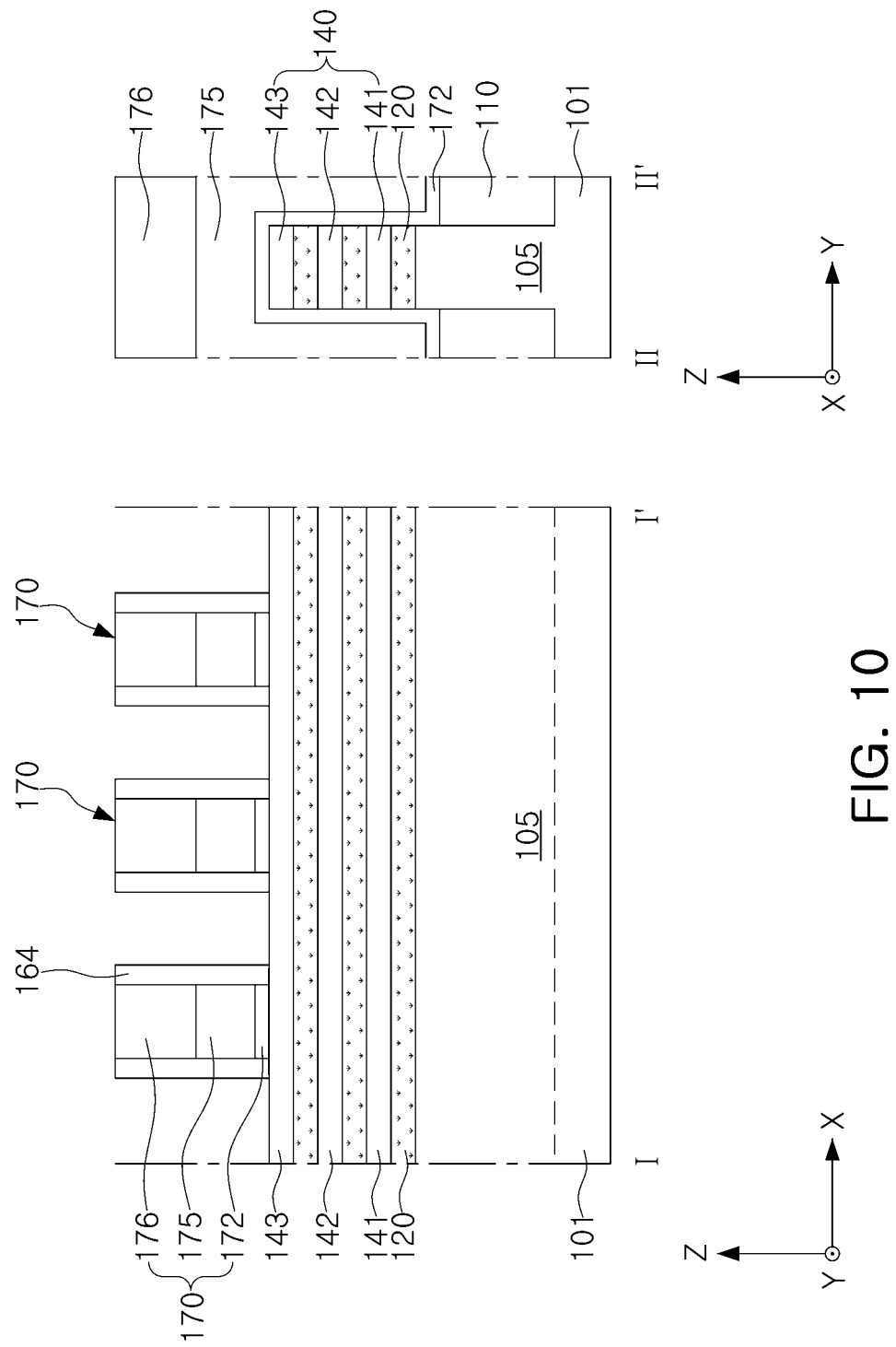

Referring to FIG. 10, sacrificial gate structures 170 and gate spacer layers 164 may be formed on the active structures.

The sacrificial gate structures 170 may be sacrificial structures formed in a region in which the gate dielectric layer 162 and the gate electrode 165 are disposed on the channel structures 140 through a subsequent process, as shown in FIG. 2. The sacrificial gate structure 170 may include first and second sacrificial gate layers 172 and 175 and a gate mask pattern layer 176 being sequentially stacked. The first and second sacrificial gate layers 172 and 175 may be patterned using the gate mask pattern layer 176. The first and second sacrificial gate layers 172 and 175 may be an insulating layer and a conductive layer, respectively, but are not limited thereto, and the first and second sacrificial gate layers 172 and 175 may be formed integrally, e.g., as one layer. For example, the first sacrificial gate layer 172 may include or be formed of silicon oxide, and the second sacrificial gate layer 175 may include or be formed of polysilicon. The gate mask pattern layer 176 may include or be formed of silicon oxide and/or silicon nitride. The sacrificial gate structures 170 may have a line shape intersecting/crossing the active structures and extending in one direction. The sacrificial gate structures 170 may extend, e.g., in the Y direction and may be disposed to be spaced apart from each other in the X direction.

The gate spacer layers 164 may be formed on both sidewalls of the sacrificial gate structures 170. The gate spacer layers 164 may be formed by forming a film having a uniform thickness on upper and side surfaces of the sacrificial gate structures 170 and on the active structures and then performing anisotropic etching of the film. The gate spacer layers 164 may include or be formed of, e.g., at least one of oxide, nitride, oxynitride, and silicon nitride-based materials.

Figure 11:
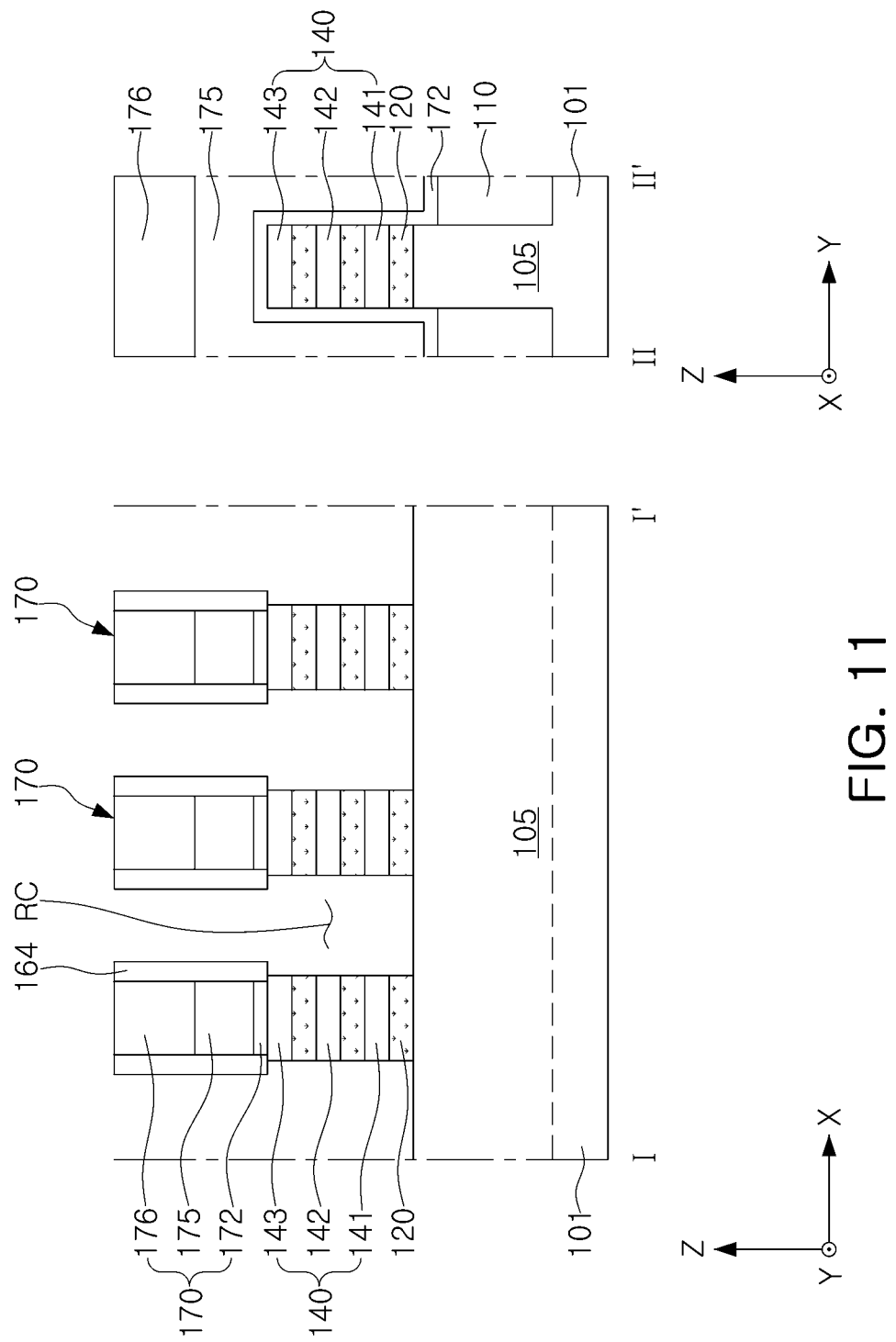

Referring to FIG. 11, the exposed sacrificial layers 120 and the plurality of channel layers 141, 142, and 143 between the sacrificial gate structures 170 may be removed to form a recess region RC, thereby forming channel structures 140.

The exposed sacrificial layers 120 and the plurality of channel layers 141, 142, and 143 may be removed, e.g., by an etching process, using the sacrificial gate structures 170 and the gate spacer layers 164 as masks, e.g., as an etching mask. Accordingly, the plurality of channel layers 141, 142, and 143 may have a limited length in the X direction and form the channel structure 140. In certain embodiments, below the sacrificial gate structures 170, portions of the sacrificial layers 120 and the channel structure 140 may be removed from the side surface so that both side surfaces in the X direction may be positioned below the sacrificial gate structures 170 and the gate spacer layers 164.

Figure 12:
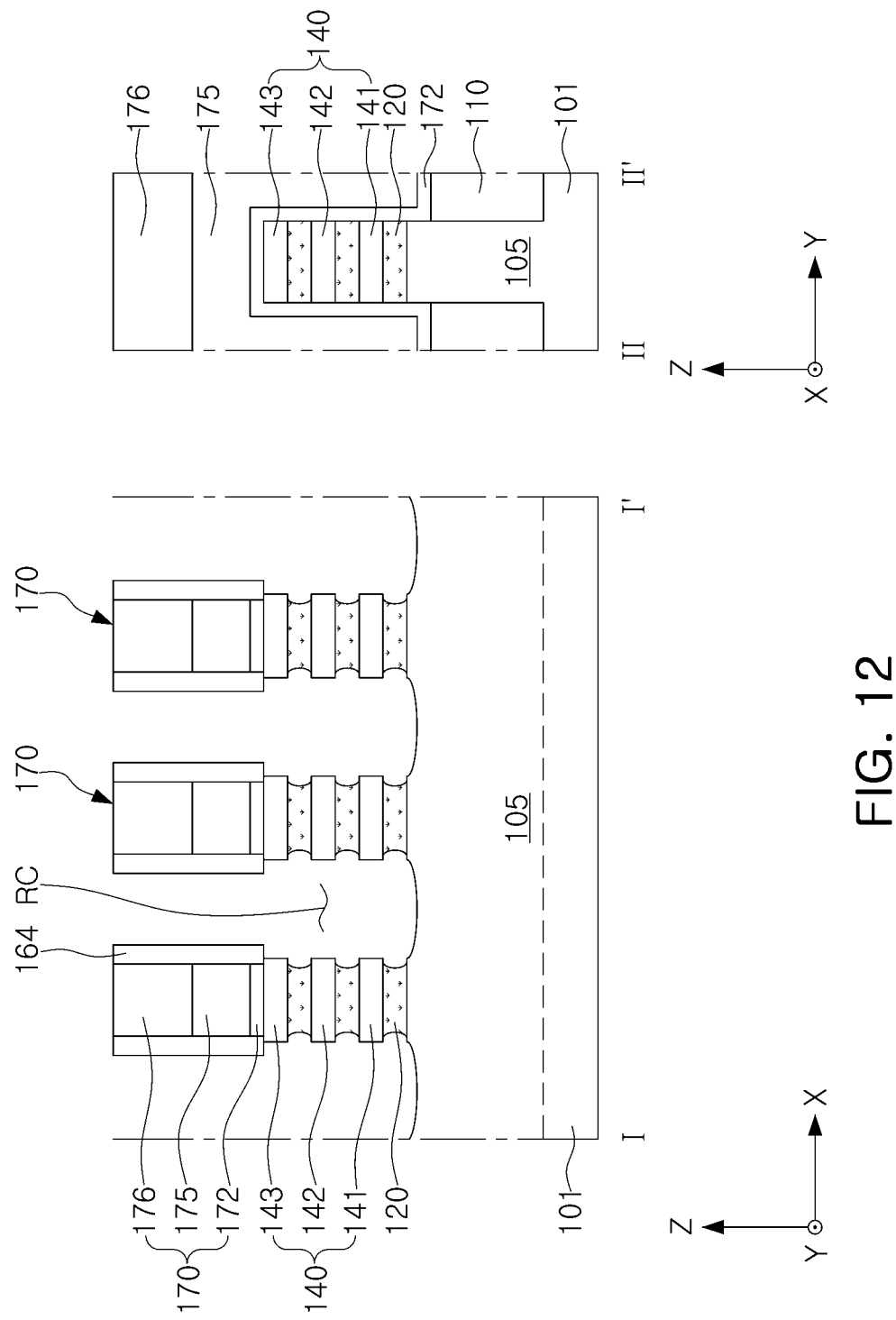

Referring to FIG. 12, the exposed sacrificial layers 120 may be partially removed from the side surface.

The sacrificial layers 120 may be selectively etched with respect to the channel structures 140, e.g., by wet etching, so as to be removed by a predetermined depth from the side surface in the X direction. The sacrificial layers 120 may have concave side surfaces by a lateral etching as described above. For example, the side surfaces of the sacrificial layers 120 may be inwardly curved at the center portion of the side surfaces. For example, centers of the side surfaces of the sacrificial layers 120 may be recessed. However, the shape of the side surfaces of the sacrificial layers 120 is not limited to the illustrated ones in FIG. 12.

Figure 13:
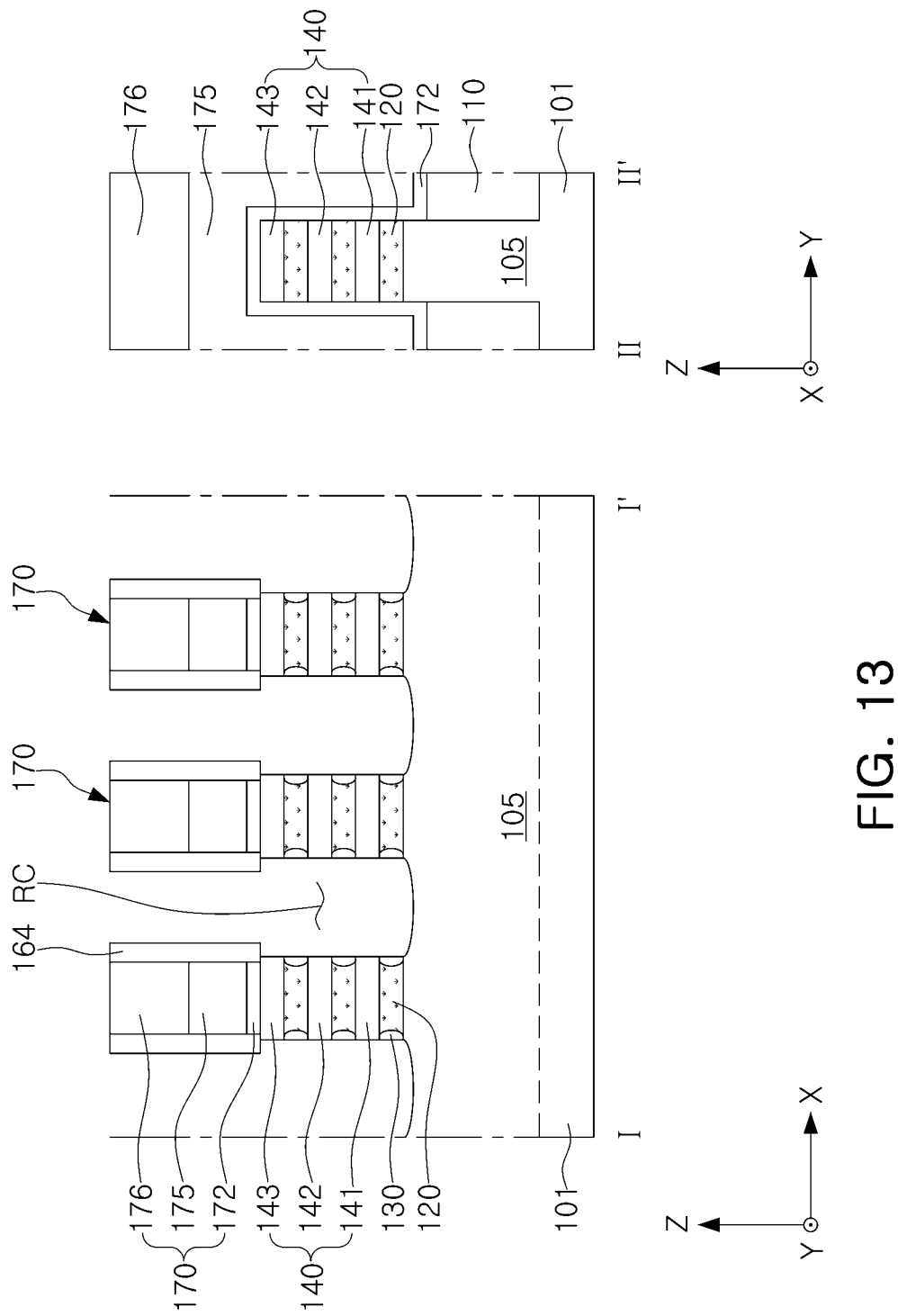

Referring to FIG. 13, internal spacer layers 130 may be formed in the region from which the sacrificial layers 120 are removed.

The internal spacer layers 130 may be formed by filling the region, from which the sacrificial layers 120 are removed, with an insulating material and then removing the insulating material deposited on the outside of the channel structures 140, e.g., side walls of the channel structures 140 and/or portions vertically non-overlapping the channel structures 140. The internal spacer layers 130 may be formed of the same material as the gate spacer layers 164, but the material of the internal spacer layers 130 is not limited thereto.

Figure 14:
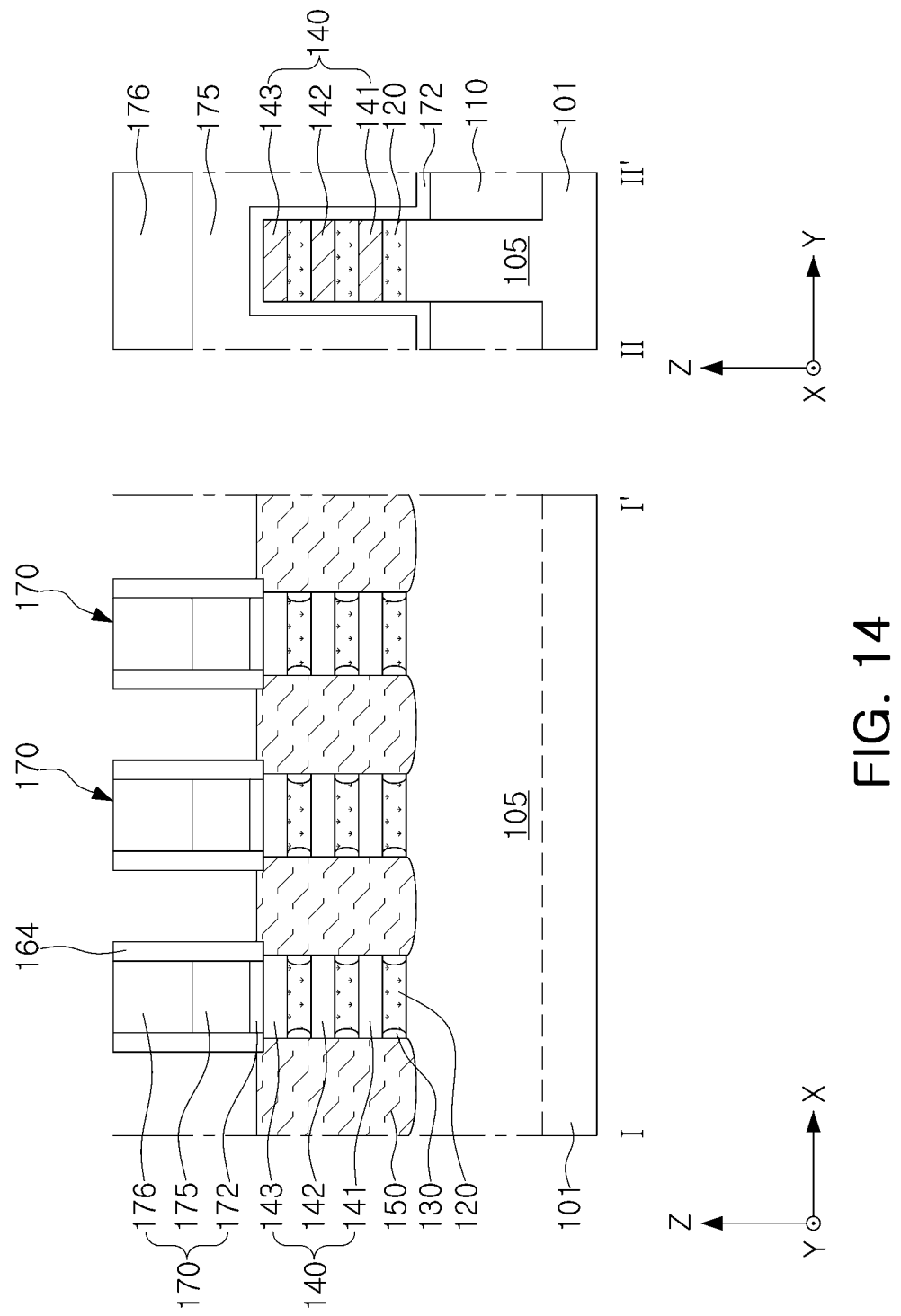

Referring to FIG. 14, on both sides of the sacrificial gate structures 170, source/drain regions 150 may be formed on the active regions 105.

The source/drain regions 150 may be formed by performing epitaxial growth. The source/drain regions 150 may be electrically connected to and/or contact the plurality of channel layers 141, 142, and 143 of the channel structures 140 through side surfaces of the channel layers 141, 142 and 143 and side surfaces of the source/drain regions 150, and may be in contact with the internal spacers 130 disposed between the plurality of channel layers 141, 142 and 143. The source/drain regions 150 may include impurities by in-situ doping and may include a plurality of layers having different doping elements and/or doping concentrations.

As such, the semiconductor device manufacturing method S1 described with reference to FIG. 7 may further include an operation of forming source/drain regions between the operation of forming the sacrificial gate structure (S10) and the operation of forming the gate structure (S20).

Figure 15:
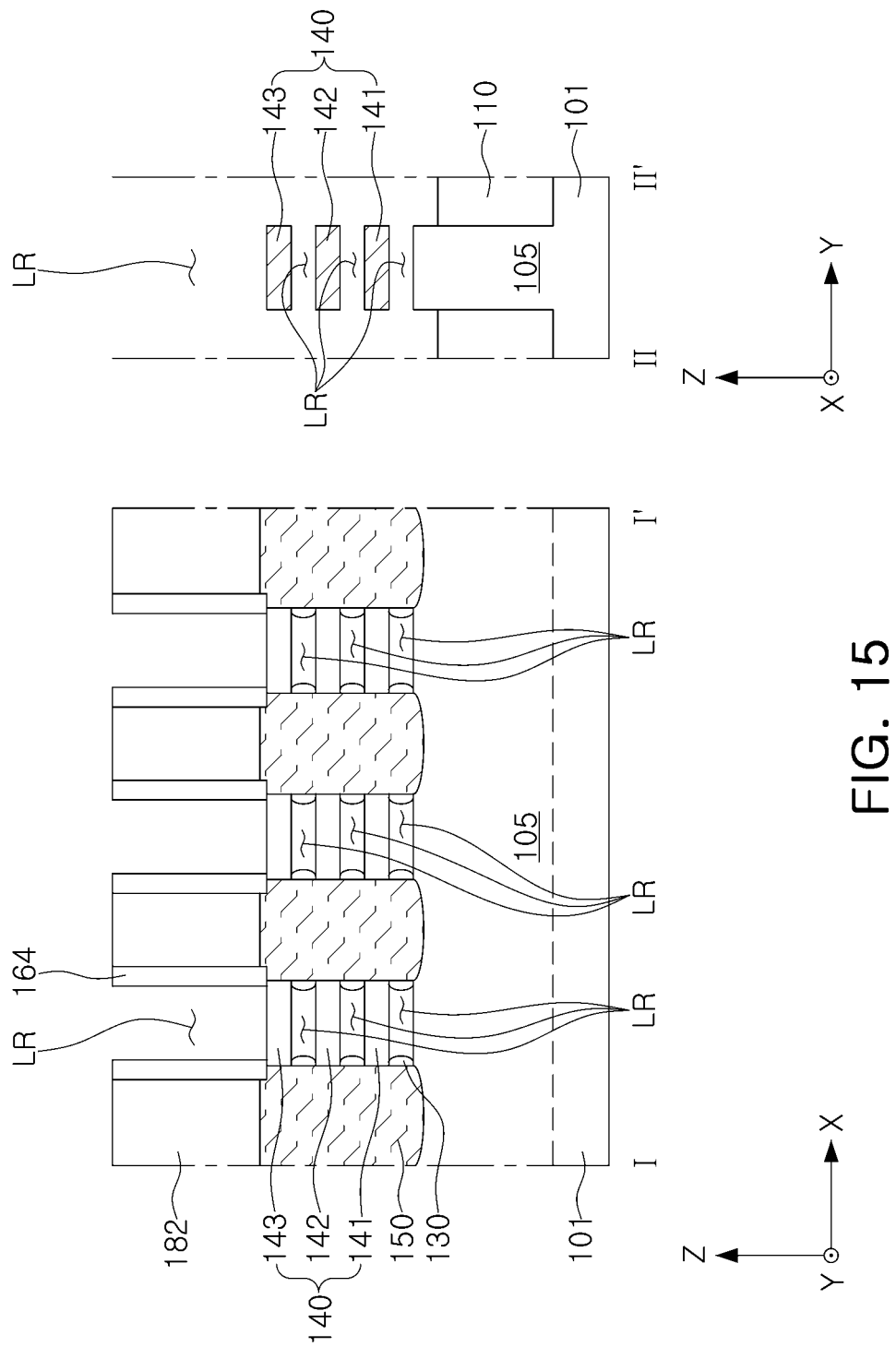
Figure 16:
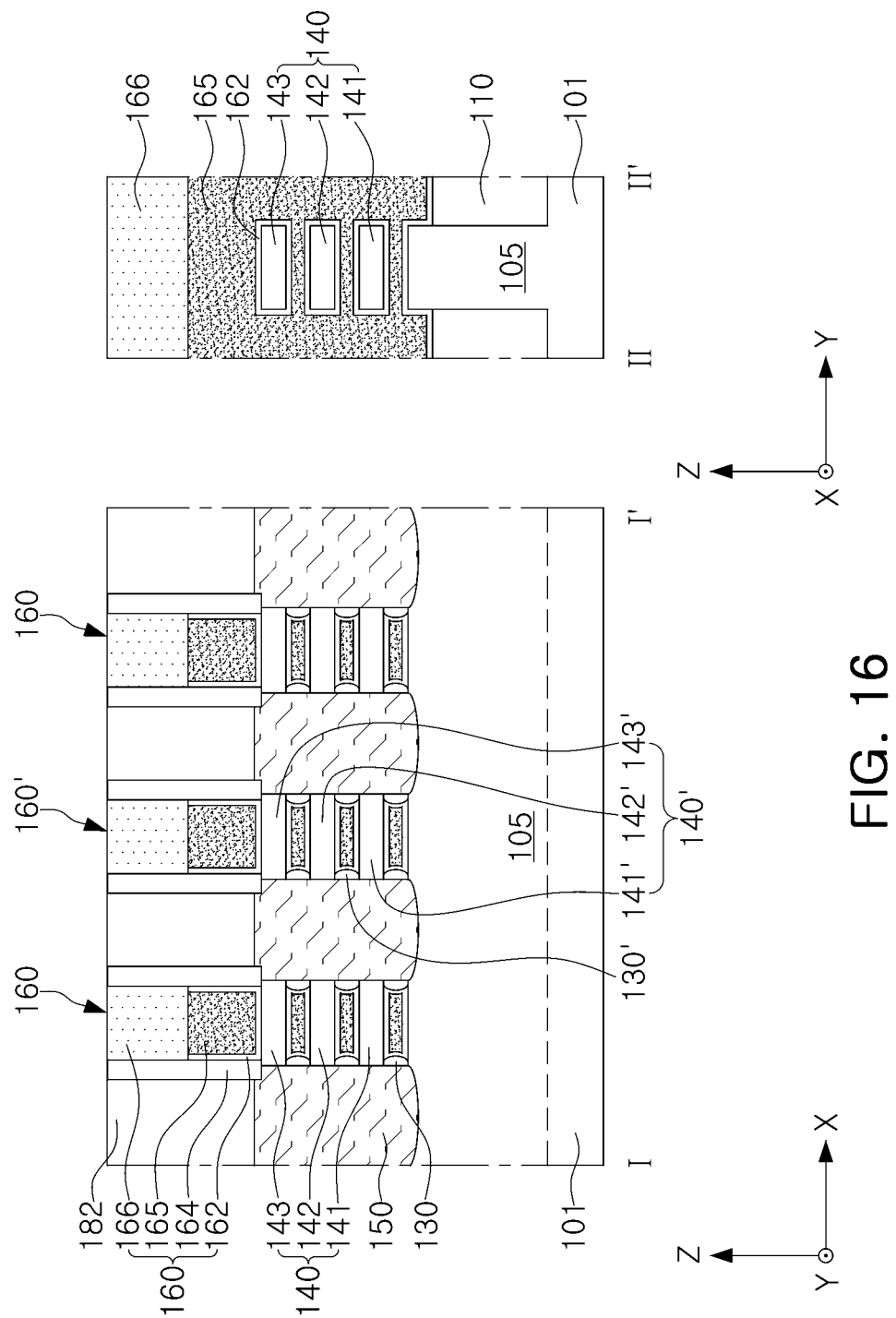

FIGS. 15 and 16 illustrate an embodiment of an operation of forming a gate structure (S20) described with reference to FIG. 7.

Referring to FIG. 15, a lower insulating layer 182 may be formed, and the sacrificial layers 120 and the sacrificial gate structures 170 may be removed.

The lower insulating layer 182 may be formed by forming an insulating layer covering the sacrificial gate structures 170 and the source/drain regions 150 and performing a planarization process.

The sacrificial layers 120 and the sacrificial gate structures 170 may be selectively removed with respect to the gate spacer layers 164, the lower insulating layer 182, and the channel structures 140. First, the sacrificial gate structures 170 may be removed to form upper gap regions UR, and thereafter, the sacrificial layers 120 exposed through the upper gap regions UR may be removed to form lower gap regions LR. For example, when the sacrificial layers 120 include silicon germanium (SiGe) and the channel structures 140 include silicon (Si), the sacrificial layers 120 may be selectively removed by performing wet etching using a peracetic acid as an etchant. During the removing operation, the source/drain regions 150 may be protected by the lower insulating layer 182 and the internal spacer layers 130.

Referring to FIG. 16, gate structures 160 may be formed in the upper gap regions UR and the lower gap regions LR.

The gate dielectric layers 162 may be formed to conformally cover inner surfaces of the upper gap regions UR and the lower gap regions LR. After the gate electrodes 165 are formed to completely fill the upper gap regions UR and the lower gap regions LR, portions of the gate electrodes 165 may be removed from the upper portion by a predetermined depth in the upper gap regions UR. A gate capping layer 166 may be formed in a region in which the portions of the gate electrodes 165 are removed from the upper gap regions UR. Accordingly, the gate structures 160 including the gate dielectric layers 162, the gate electrodes 165, the gate spacer layers 164, and gate capping layers 166 may be formed. In an example embodiment, the gate capping layers 166 may include or be formed of a silicon nitride-based material.

At least one of the gate structures 160 may be a dummy gate structure 160' from which a portion is removed in a subsequent process. At least one of the channel structures 140 may be a dummy channel structure 140' from which a portion is removed together with the dummy gate structure 160' in a subsequent process. The dummy channel structure 140' may correspond to the dummy gate structure 160'. For example, the dummy channel structure 140' may vertically overlap the dummy gate structure 160'.

Figure 17:
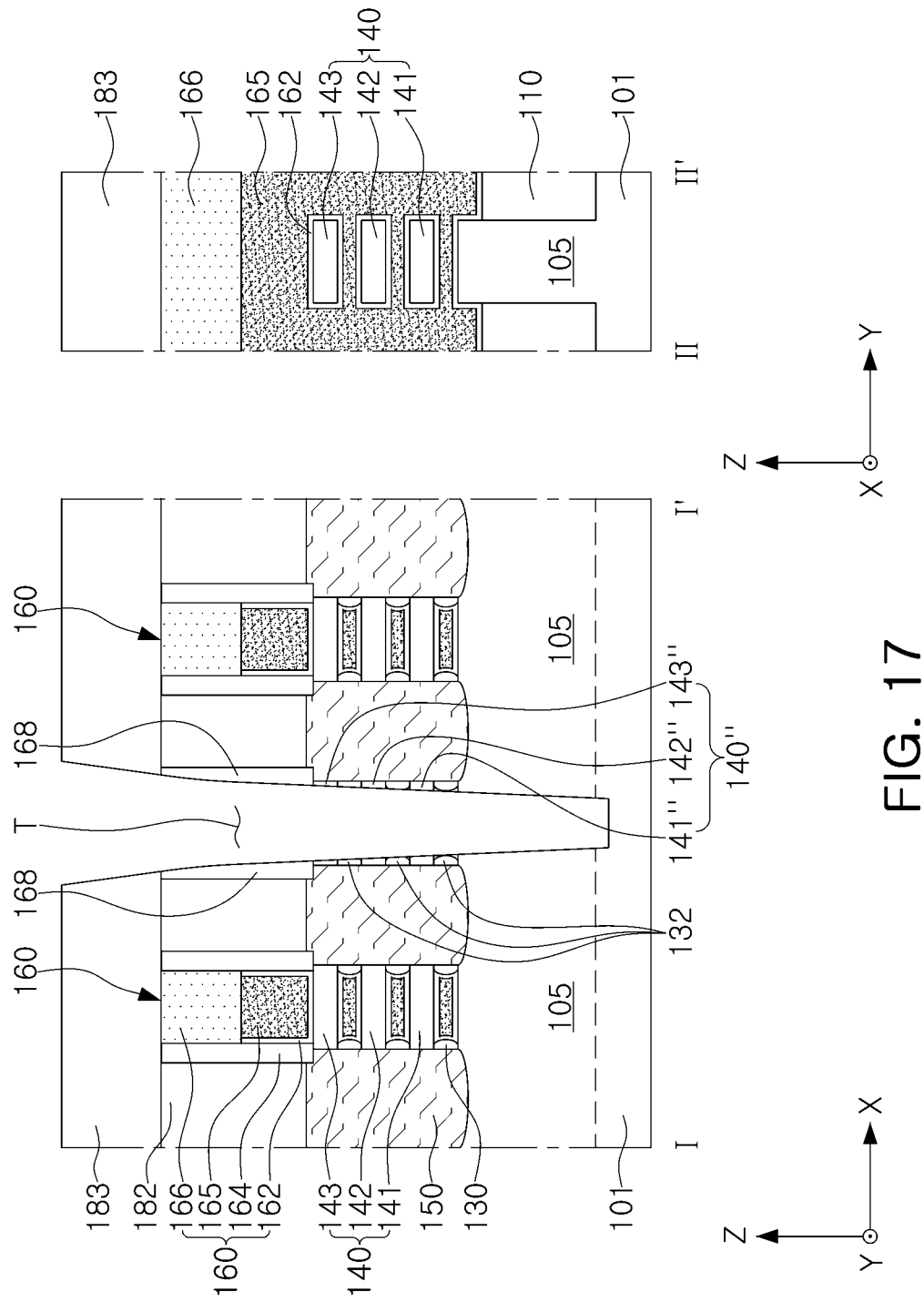

FIG. 17 illustrates an embodiment of the operation of forming an isolation opening (S30) described with reference to FIG. 7.

Referring to FIG. 17, an intermediate insulating layer 183 may be formed on the gate structures 160 and the lower insulating layer 182, and an isolation opening T may be formed to extend to a level below a lower end of the active region 105 through the intermediate insulating layer 183, the dummy gate structure 160', and the dummy channel structure 140'. Accordingly, a portion of the dummy gate structure 160' and a portion of the dummy channel structure 140' may be removed.

The intermediate insulating layer 183 may include or be formed of a material having an etch selectivity with respect to the gate capping layer 166. The intermediate insulating layer 183 may include or be formed of an oxide or a compound including silicon. For example, the intermediate insulating layer 183 may include or be formed of tetraethyl orthosilicate (TEOS).

The isolation opening T may intersect the active region 105 and extend in the second direction, e.g., the Y direction. The isolation opening T may have an inclined side surface in which a width of the lower portion thereof is smaller than a width of an upper portion thereof depending on the aspect ratio. For example, the width of the isolation opening T in a horizontal direction, e.g., in the X direction may gradually decrease in a direction approaching the bottom surface of the substrate 101. The lower portion (e.g., the bottom surface) of the isolation opening T may have a flat surface or may have a convex shape or a pointed shape toward the substrate 101, e.g., toward the bottom surface of the substrate 101, but the shape of the bottom surface of the isolation opening T is not limited thereto. A lower end of the isolation opening T may be lower than a lower end of the active region 105.

With the isolation opening T formed, some portions of the dummy gate spacer layers 164' may be removed, and the other portions of the dummy gate spacer layers 164' of the dummy gate structure 160' may remain as the isolation spacer layers 168 on the side surfaces of the isolation opening T.

As the isolation opening T is formed, some portions of the dummy channel layers 140' may be removed, and the other portions of the dummy channel layers 140' may remain on side surfaces of the isolation opening T. In an example embodiment, some portions of the internal spacer layers 130' (refer to FIG. 16) disposed on both sides of the dummy gate structure 160' are removed, and the other portions of the internal spacer layers 130' may remain as the isolation insulating layer 132.

Figure 18:
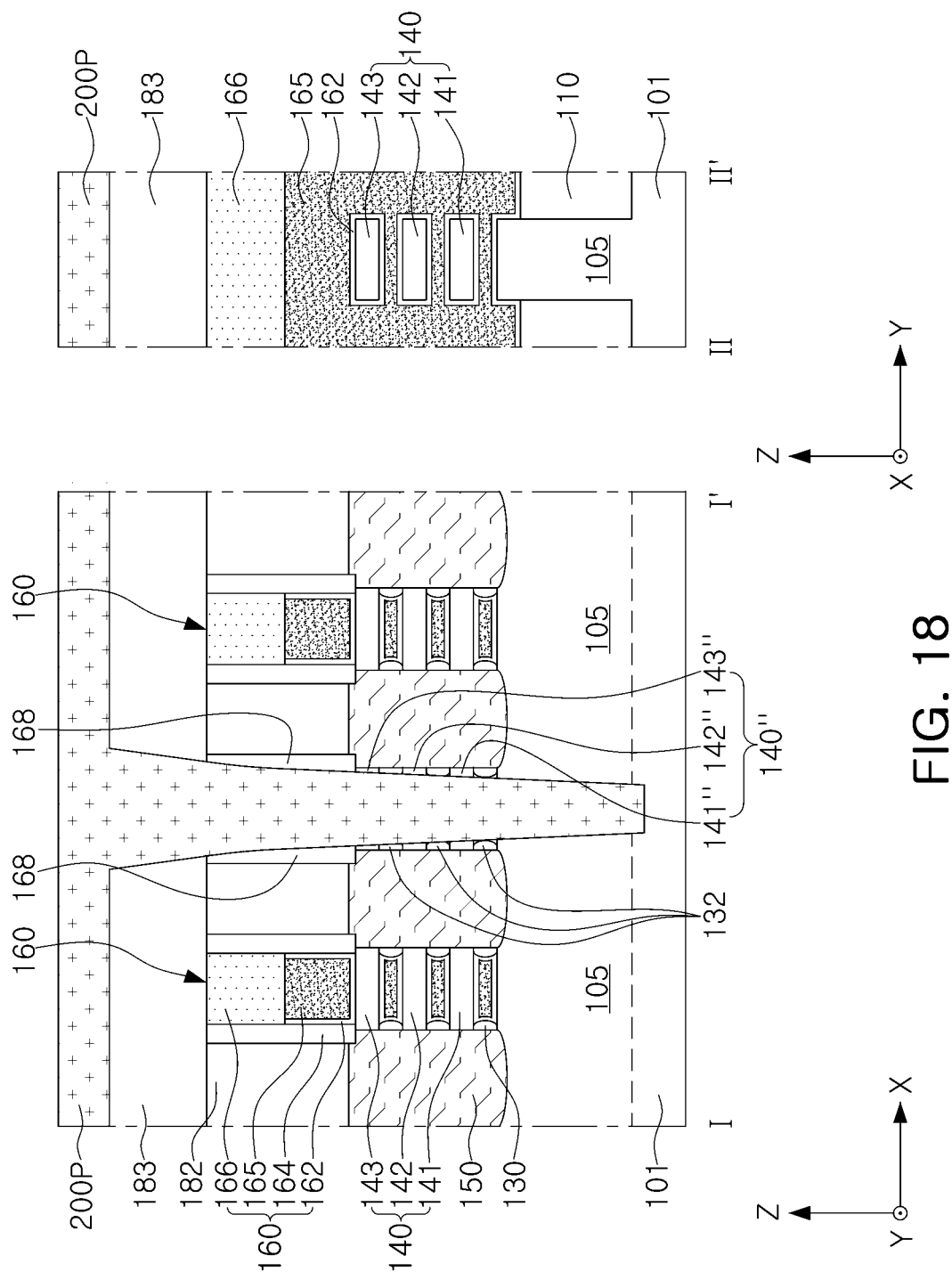
Figure 19:
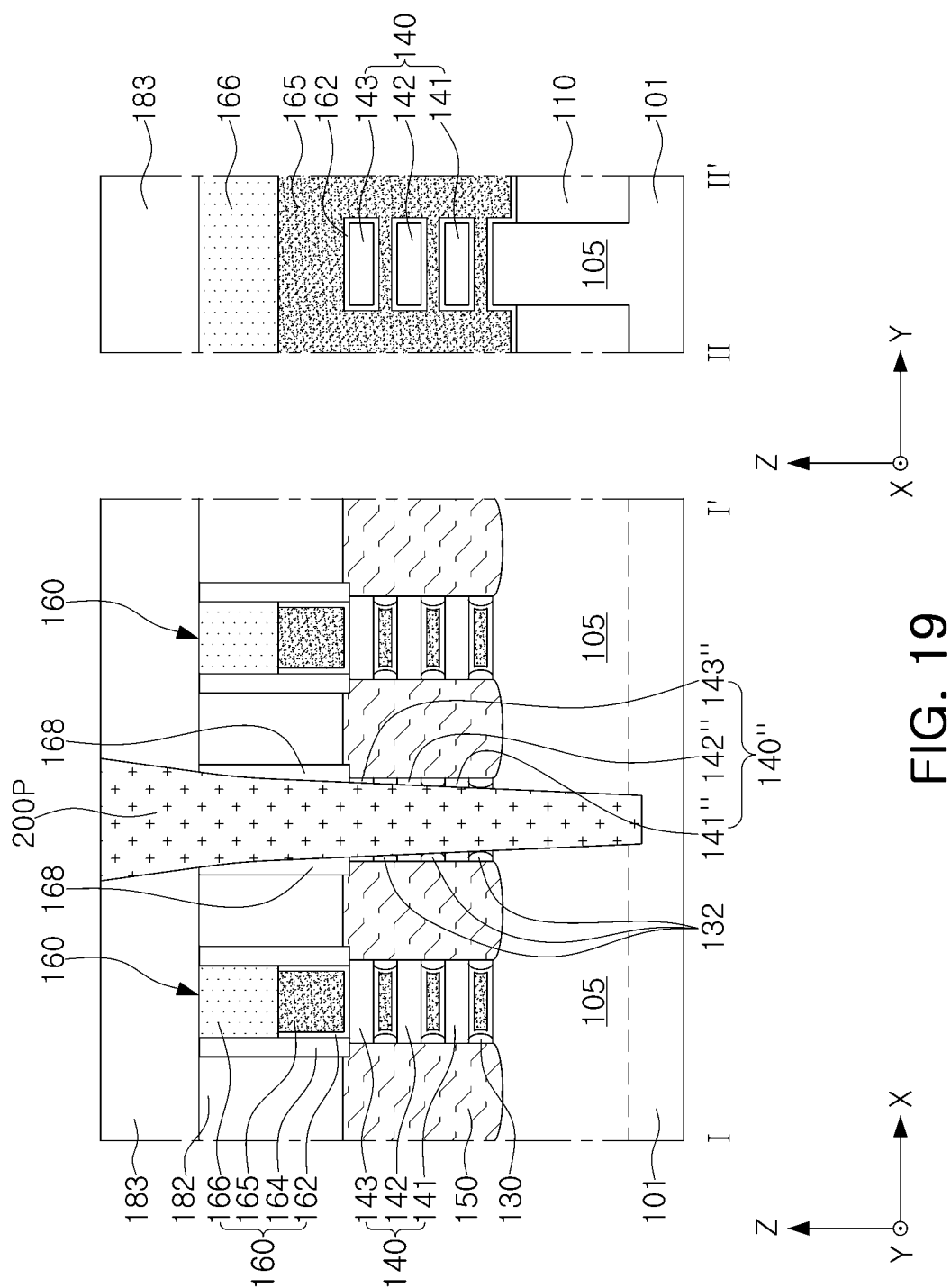

FIGS. 18 and 19 illustrate an embodiment of the operation of depositing an isolation pattern (S40) described with reference to FIG. 7.

Referring to FIG. 18, an isolation pattern 200P may be formed to fill an inside of the isolation opening T and cover an upper portion of the intermediate insulating layer 183. The isolation pattern 200P may have a density and/or hardness lower than those of the gate capping layer 166. The isolation pattern 200P may include or be formed of a silicon nitride-based material, but may have a density and/or hardness lower than those of the gate capping layer 166. A method of depositing a silicon nitride-based material included in the isolation pattern 200P may be different from a method of depositing a silicon nitride-based material included in the gate capping layer 166.

Referring to FIG. 19, a planarization process may be performed to remove a portion of the isolation pattern 200P covering an upper portion of the intermediate insulating layer 183. Accordingly, an upper surface of the intermediate insulating layer 183 may be exposed.

Figure 20:
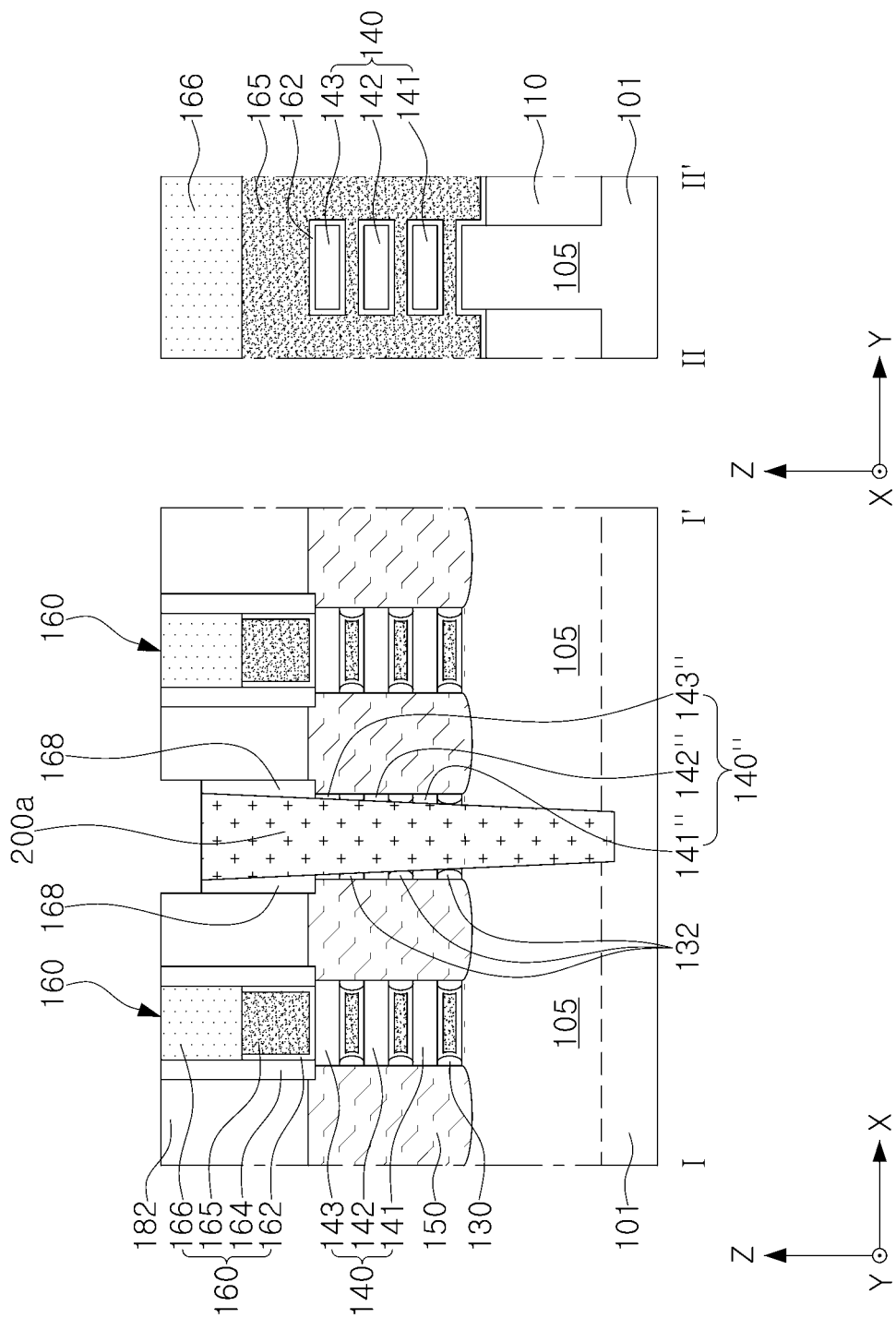

FIG. 20 illustrates an embodiment of the operation of performing a planarization process step (S50) described with reference to FIG. 7.

Referring to FIG. 20, the entire intermediate insulating layer 183 and a partial region of the isolation pattern 200P may be removed through a chemical mechanical polishing (CMP) process to form an isolation structure 200a.

In order to prevent instability of formation of a contact structure due to the non-uniformity of a thickness of the intermediate insulating layer 183 and the isolation pattern 200P disposed inside the intermediate insulating layer 183 in forming a subsequent contact structure is formed, the entire intermediate insulating layer 183 may be performed a planarization process of removing.

In an example embodiment, the isolation pattern 200P and the gate capping layer 166 may each include or be formed of a silicon nitride-based material, and the intermediate insulating layer 183 may include or be formed of an oxide or a compound including silicon. Since density and/or hardness of the isolation pattern 200P is less than density and/or hardness of the gate capping layer 166, a portion of the isolation pattern 200P may be removed together in the process of removing the intermediate insulating layer 183. Accordingly, a portion of the isolation pattern 200P penetrating (e.g., horizontally overlapping) the intermediate insulating layer 183 and the entire intermediate insulating layer 183 may be removed together to expose an upper surface of the gate structure 160 and an upper surface of the lower insulating layer 182. As the planarization process is performed, the upper surface of the gate capping layer 166 may be exposed. In this case, since the density and/or hardness of the isolation pattern 200P is less than the density and/or hardness of the gate capping layer 166, the isolation structure 200a having an upper surface at a level lower than the upper surface of the gate capping layer 166 may be formed when the planarization process is performed.

FIGS. 21 to 24 illustrate an embodiment of the operation of forming a contact structure (S60) described with reference to FIG. 7.

Figure 21:
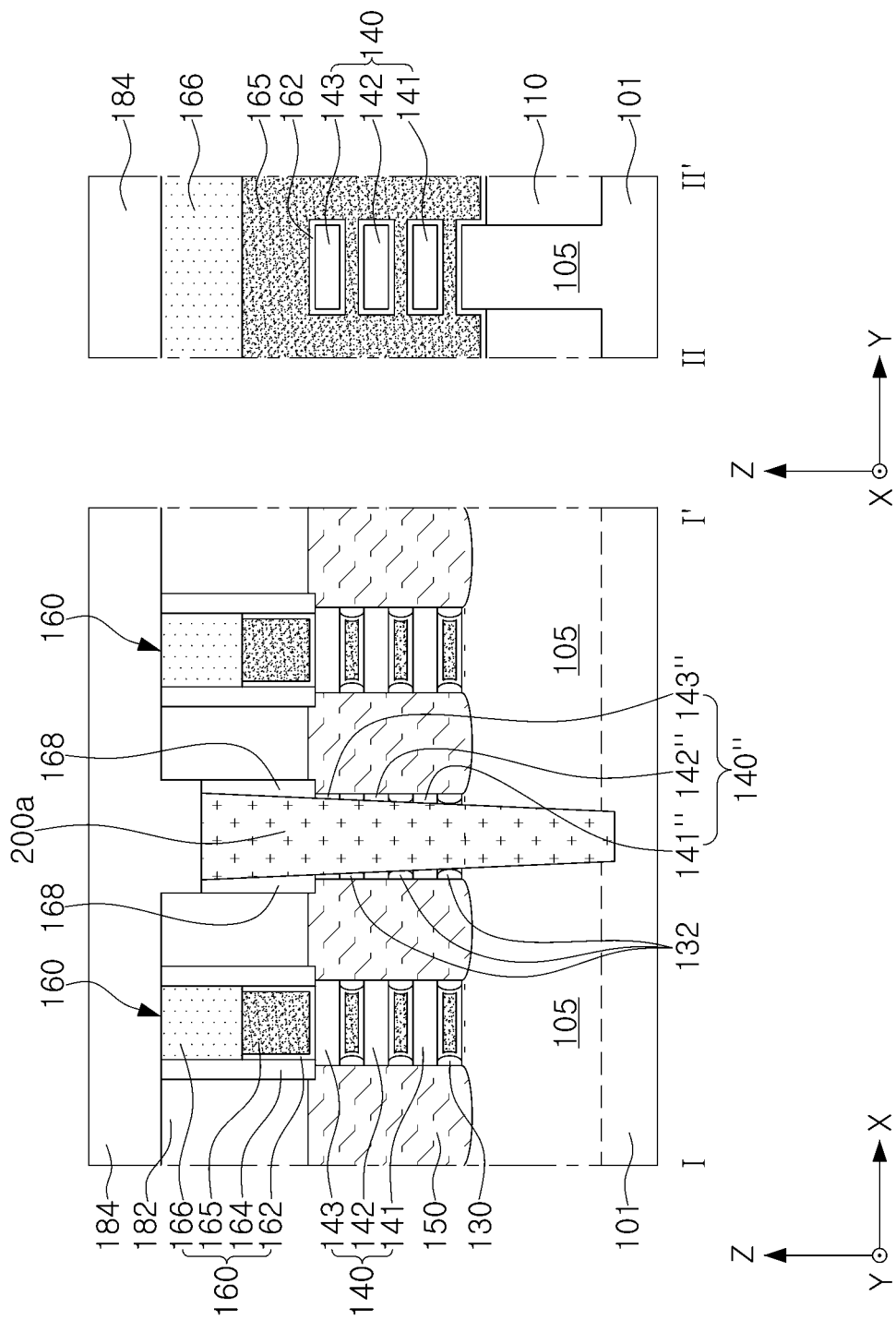

Referring to FIG. 21, a first insulating layer 184 may be formed on the gate structure 160 and the lower insulating layer 182. The first insulating layer 184 may include or be formed of an oxide or a compound including silicon.

Figure 22:
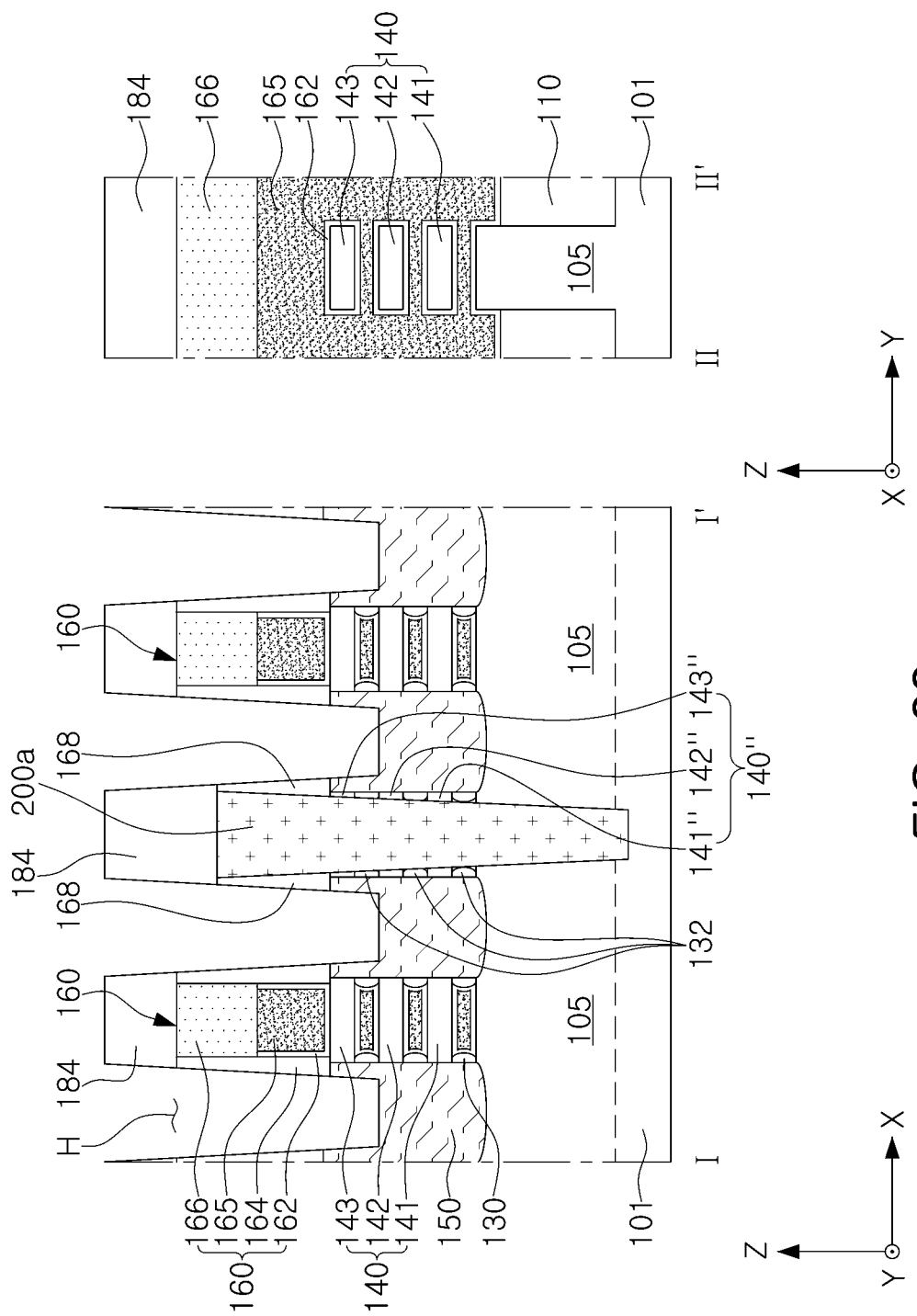

Referring to FIG. 22, in a region corresponding to the contact structure 180 of FIG. 2, the lower insulating layer 182 and the first insulating layer 184 may be removed to form a penetrating contact hole H. By performing the planarization process described with reference to FIG. 20, a vertical thickness of the first insulating layer 184 may be formed to be substantially uniform and an isolation pattern may not exist in the first insulating layer 184. For example, the isolation pattern 200a may not horizontally overlap the first insulating layer 184. Accordingly, an etching process may be stably performed so that a region corresponding to the contact structure 180 of FIG. 2 may be removed, thereby preventing formation of a defective contact hole H.

Figure 23:
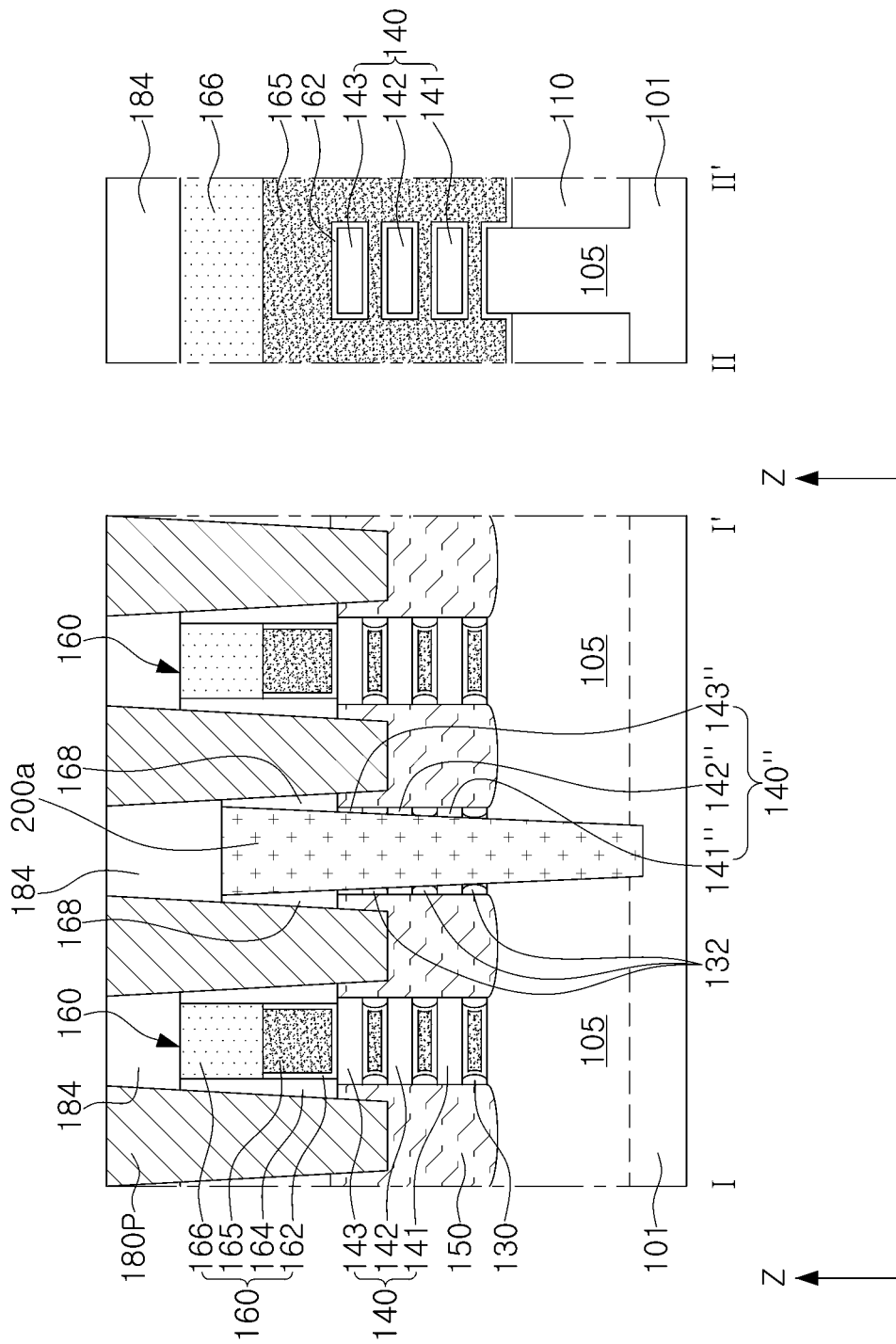
Figure 24:
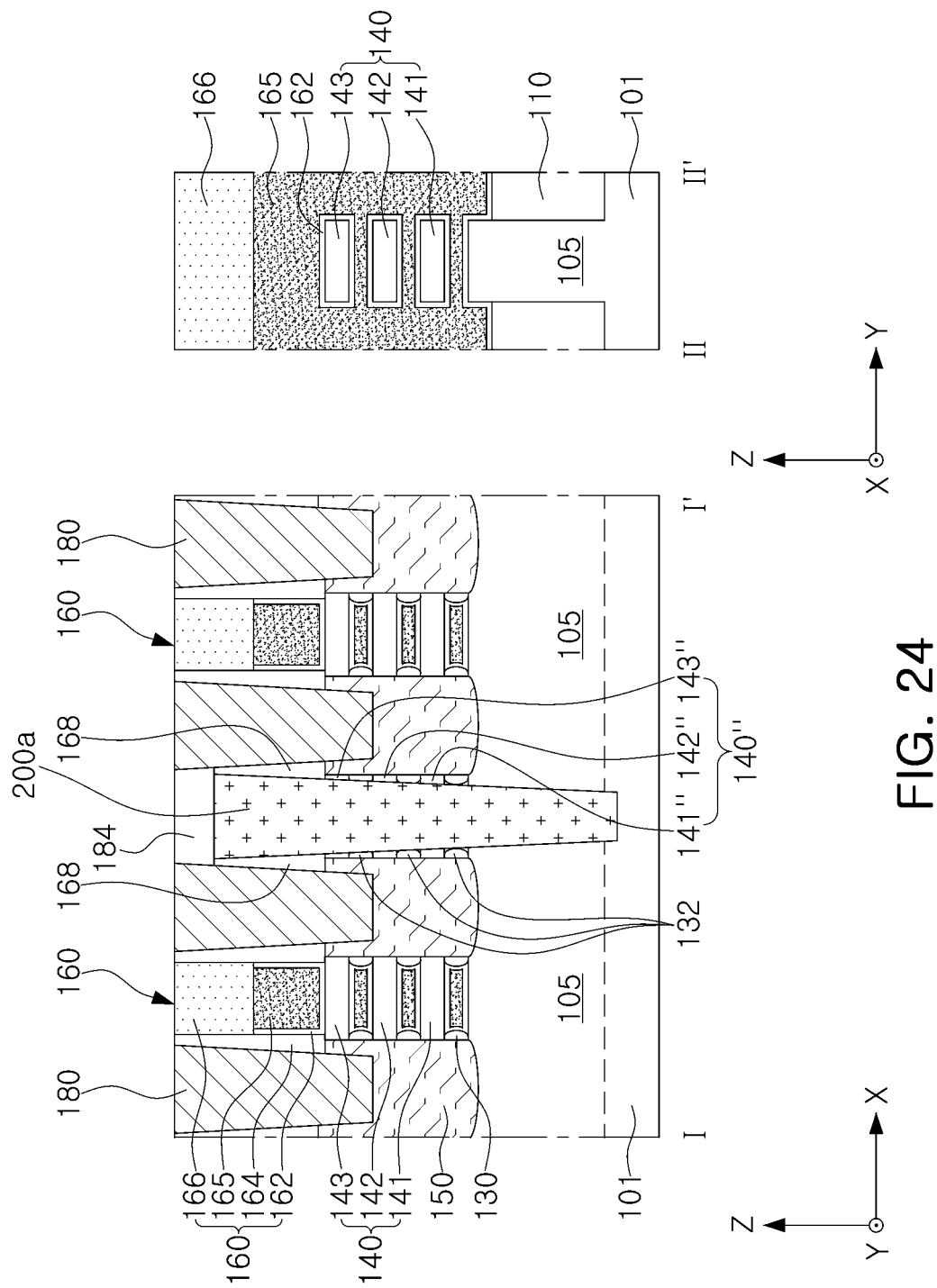

Referring to FIGS. 23 and 24, the contact hole H may be filled with a conductive material, and a planarization process may be performed to form a contact structure 180. According to example embodiments, an upper surface of the contact structure 180 may be formed to be disposed at substantially the same level as the upper surface of the gate structure 160, but the level of the upper surface of the contact structure 180 is not limited thereto.

Next, after an etch stop layer 185 and a second insulating layer 195 are formed, a partial region of each of the etch stop layer 185 and the second insulating layer 195 may be removed. Thereafter, a region from which portions of the etch stop layer 185 and the second insulating layer 195 are removed may be filled with a conductive material to form a conductive via 190 in contact with the contact structure.

As set forth above, in the case of forming an isolation structure, after depositing an insulating material in the opening, a planarization process may be performed to remove all of insulating layers on the gate structure, thereby stably forming a contact structure. Accordingly, a semiconductor device having improved reliability may be provided.

When the isolation structure is formed, a contact structure may be stably formed in a subsequent process by forming a gate capping layer of a gate structure and an isolation structure to have different densities and/or hardness.

While example embodiments have been shown and described above, it will be apparent to those skilled in the art that modifications and variations could be made without departing from the scope of the present inventive concept as defined by the appended claims.

What is claimed is:

1. A semiconductor device comprising:
an active region extending in a first direction on a substrate;
a plurality of channel layers vertically spaced apart from each other on the active region;
a gate structure vertically overlapping the active region and the plurality of channel layers on the substrate, extending in a second direction, and including a gate electrode surrounding the plurality of channel layers and a gate capping layer disposed on an upper surface of the gate electrode;
a first source/drain region disposed on a side of the gate structure on the active region and in contact with the plurality of channel layers;
a solid isolation structure intersecting the active region on the substrate, extending in the second direction, and disposed between the first source/drain region and a second source/drain region adjacent to each other;
a first insulating layer disposed on an upper surface of the solid isolation structure, and
contact structures in contact with the first source/drain region and the second source/drain region,
wherein the upper surface of the solid isolation structure is disposed at a height lower than that of an upper surface of the gate capping layer and higher than a lower surface of the gate capping layer in a direction perpendicular to an upper surface of the substrate, and an upper surface of the first insulating layer is coplanar with an upper surface of a first contact structure of the contact structures.

2. The semiconductor device of claim 1, further comprising:
an etch stop layer disposed on the gate structure, the first insulating layer, and the contact structures;
a second insulating layer disposed on the etch stop layer; and
a conductive via in contact with one of the contact structures, the conductive via penetrating the second insulating layer and the etch stop layer.

3. The semiconductor device of claim 2, wherein the solid isolation structure and the etch stop layer are spaced apart from each other.

4. The semiconductor device of claim 1, wherein a density of the solid isolation structure is less than a density of the gate capping layer.

5. The semiconductor device of claim 1, wherein a hardness of the solid isolation structure is less than a hardness of the gate capping layer.

6. The semiconductor device of claim 1, wherein the solid isolation structure and the gate capping layer each include a silicon nitride-based material.

7. The semiconductor device of claim 1, further comprising internal spacer layers disposed on both sides of the gate structure in the first direction on a lower surface of each of the plurality of channel layers and having an outer surface substantially coplanar with an outer surface of the plurality of channel layers.

8. The semiconductor device of claim 7, further comprising:
a plurality of dummy channel layers disposed between the solid isolation structure and the first source/drain region and an isolation insulating layer disposed between adjacent pairs of the plurality of dummy channel layers,
the plurality of dummy channel layers include the same material as that of the plurality of channel layers, and
the isolation insulating layer includes a same material as that of the internal spacer layers.

9. The semiconductor device of claim 1, wherein an uppermost surface of at least one of the contact structures is disposed higher than the upper surface of the solid isolation structure in a direction perpendicular to the upper surface of the substrate.

10. The semiconductor device of claim 1, wherein an upper surface of a second contact structure of the contact structures is disposed at a height lower than that of the upper surface of the solid isolation structure in a direction perpendicular to the upper surface of the substrate.

11. The semiconductor device of claim 10, wherein the first insulating layer extends to the upper surface of the second contact structure.

12. The semiconductor device of claim 1, wherein the gate structure includes gate spacer layers disposed on both side surfaces of the gate electrode.

13. The semiconductor device of claim 12, wherein the upper surface of the solid isolation structure is disposed at a height lower than that of an upper surface of the gate spacer layers in a direction perpendicular to the substrate.

14. The semiconductor device of claim 12, further comprising:
isolation spacer layers disposed on both side surfaces of the solid isolation structure,
wherein an upper surface of the isolation spacer layers is disposed at a height lower than that of the upper surface of the gate capping layer in a direction perpendicular to the upper surface of the substrate.

15. A semiconductor device comprising:
an active region extending in a first direction on a substrate;
a first channel layer on the active region;
a second channel layer on the active region;
a first gate structure vertically overlapping the active region on the substrate and the first channel layer, extending in a second direction, and including a first gate electrode and a first gate capping layer disposed on the first gate electrode;
a second gate structure vertically overlapping the active region on the substrate and the second channel layer, extending in the second direction, and including a second gate electrode and a second gate capping layer disposed on the second gate electrode;
a first source/drain region disposed on a first side of the first gate structure and in contact with the first channel layer;
a second source/drain region disposed on a second side of the second gate structure and in contact with the second channel layer;
a solid isolation structure intersecting the active region to divide the active region into two sub-active regions on the substrate, extending in the second direction, disposed between the first gate structure and the second gate structure, and isolating the two sub-active regions from each other;
a first dummy channel layer disposed between the first source/drain region and the solid isolation structure;
a second dummy channel layer disposed between the second source/drain region and the solid isolation structure;
a first contact structure in contact with the first source/drain region;
a second contact structure in contact with the second source/drain region; and
a first insulating layer in contact with an upper surface of the solid isolation structure,
wherein the upper surface of the solid isolation structure is disposed at a height lower than that of an upper surface of the first gate capping layer and higher than a lower surface of the first gate capping layer in a direction perpendicular to an upper surface of the substrate, and
wherein an upper surface of the first insulating layer and an upper surface of the first contact structure are coplanar.

16. The semiconductor device of claim 15, wherein a hardness of the solid isolation structure is lower than a hardness of the first gate capping layer.

17. The semiconductor device of claim 15, wherein the solid isolation structure and the first gate capping layer each include a silicon nitride-based material.

18. The semiconductor device of claim 15, further comprising:
an etch stop layer disposed on the first gate structure, the second gate structure, the first insulating layer, the first contact structure, and the second contact structure;
a second insulating layer disposed on the etch stop layer; and
a conductive via penetrating through the second insulating layer and the etch stop layer.

19. The semiconductor device of claim 15, wherein an upper surface of the second contact structure is disposed at a height lower than the upper surface of the solid isolation structure in a direction perpendicular to the upper surface of the substrate.

* * * * *